United States Patent
Xie et al.

(10) Patent No.: US 10,373,875 B1
(45) Date of Patent: Aug. 6, 2019

(54) CONTACTS FORMED WITH SELF-ALIGNED CUTS

(71) Applicant: GLOBALFOUNDRIES Inc., Grand Cayman (KY)

(72) Inventors: Ruilong Xie, Niskayuna, NY (US); Daniel Jaeger, Saratoga Springs, NY (US); Chanro Park, Clifton Park, NY (US); Laertis Economikos, Wappingers Falls, NY (US); Haiting Wang, Clifton Park, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/928,783

(22) Filed: Mar. 22, 2018

(51) Int. Cl.
*H01L 21/8234* (2006.01)
*H01L 29/66* (2006.01)
(Continued)

(52) U.S. Cl.
CPC ............... *H01L 21/823481* (2013.01); *H01L 21/31144* (2013.01); *H01L 21/76224* (2013.01); *H01L 21/823418* (2013.01); *H01L 21/823431* (2013.01); *H01L 27/0886* (2013.01); *H01L 29/66545* (2013.01)

(58) Field of Classification Search
CPC ....... H01L 21/823481; H01L 21/31144; H01L 21/76224; H01L 21/823418; H01L 21/823431; H01L 27/0886; H01L 29/66545; H01L 21/76805; H01L 21/0332; H01L 21/76895; H01L 21/823475;
(Continued)

(56) References Cited

U.S. PATENT DOCUMENTS 9,390,979 B2 7/2016 Wei et al.
2011/0298061 A1 12/2011 Siddiqui et al.
(Continued)

OTHER PUBLICATIONS

Bouche et al., "Self-Aligned Contact Etch for Fabricating a FinFET", U.S. Appl. No. 15/598,447, filed May 18, 2017.
(Continued)

*Primary Examiner* — Shahed Ahmed
(74) *Attorney, Agent, or Firm* — Thompson Hine LLP; Francois Pagette

(57) ABSTRACT

Methods of fabricating structures that include contacts coupled with a source/drain region of a field-effect transistor. Source/drain regions are formed adjacent to a temporary gate structure. In one process, a sacrificial layer is disposed over the source/drain regions and a dielectric pillar is formed in the sacrificial layer between the source/drain regions, followed by deposition of a fill material, replacement of the temporary gate structure with a functional gate structure, and removal of the fill material. In another process, the fill material is formed first and the temporary gate structure is replaced by a functional gate structure; following removal of the fill material, a sacrificial layer is disposed over the source/drain regions and a dielectric pillar is formed in the sacrificial layer between the source/drain regions. A conductive layer having separate portions contacting the separate source/drain regions is formed, with the dielectric pillar separating the portions of the conductive layer.

9 Claims, 30 Drawing Sheets

(51) Int. Cl.
*H01L 27/088* (2006.01)
*H01L 21/311* (2006.01)
*H01L 21/762* (2006.01)

(58) Field of Classification Search
CPC ..... H01L 21/823425; H01L 29/41725–41791; H01L 29/7839; H01L 29/806; H01L 21/823871
See application file for complete search history.

(56) References Cited

U.S. PATENT DOCUMENTS

| | | | |
|---|---|---|---|
| 2012/0211837 A1 | 8/2012 | Baars et al. | |
| 2013/0277752 A1 | 10/2013 | Glass et al. | |
| 2015/0214059 A1* | 7/2015 | Bouche | H01L 21/2807 257/369 |
| 2018/0294184 A1* | 10/2018 | Koh | H01L 21/0332 |
| 2018/0331179 A1* | 11/2018 | Cheng | H01L 29/7848 |
| 2018/0337176 A1* | 11/2018 | Lee | H01L 21/823481 |

OTHER PUBLICATIONS

Bouche et al., "Gate Pickup Method Using a Metal Selectivity", U.S. Appl. No. 15/598,393, filed May 18, 2017.

* cited by examiner

CONTACTS FORMED WITH SELF-ALIGNED CUTS

BACKGROUND

The present invention relates to semiconductor device fabrication and integrated circuits and, more specifically, to methods of fabricating structures that include contacts coupled with a source/drain region of a field-effect transistor and related structures.

As circuit sizes have continued to shrink, modifications to processes for fabricating active devices of an integrated circuit become necessary to ensure proper functioning of the circuit and devices and prevent issues such as electrical shorts. Fabrication techniques that work for making integrated circuits with larger feature sizes may break down for smaller feature sizes, requiring new processes to be developed to replace outdated methods. For example, in many fabrication processes an interlayer dielectric is formed ahead of trench silicidation processes to form conductive contacts between metal layers and active devices; portions of the interlayer dielectric remain as pillars while other portions are removed to allow for formation of conductive contacts. However, some sacrificial interlayer dielectric materials, such as amorphous silicon, will end up with "voids" formed during deposition of the material, and these voids can trap other dielectric materials in successive fabrication steps that can partially or entirely prevent removal of the interlayer dielectric, resulting in poor conductive contact structures. Other interlayer dielectric materials are difficult to remove because the etchants used to remove the materials cannot achieve perfect selectivity to the interlayer dielectric material, and may partially remove other portions of the circuit structure that must remain intact; other etchants that can achieve such high selectivity may no longer be usable with smaller feature sizes.

SUMMARY

In an embodiment of the invention, a method includes forming a first source/drain region and a second source/drain region adjacent to a temporary gate structure and forming a sacrificial layer over the first source/drain region and the second source/drain region. A trench is etched in the sacrificial layer between the first source/drain region and the second source/drain region, and a dielectric material is deposited in the trench to form a dielectric pillar. After the dielectric material has been deposited in the trench, a fill layer is formed over the first source/drain region and the second source/drain region. The temporary gate structure is then replaced with a functional gate structure, and the fill layer is removed. A conductive layer is formed with a first portion contacting the first source/drain region and a second portion contacting the second source/drain region. The dielectric pillar separates the first portion of the conductive layer from the second portion of the conductive layer.

In another embodiment of the invention, a method includes forming a first source/drain region and a second source/drain region adjacent to a temporary gate structure. A fill layer is formed over the first source/drain region and the second source/drain region. The temporary gate structure is then replaced with a functional gate structure, and the fill layer is removed. A sacrificial layer is formed over the first source/drain region and the second source/drain region. A trench is etched in the sacrificial layer between the first source/drain region and the second source/drain region, and a dielectric material is deposited in the trench to form a dielectric pillar. A conductive layer is formed with a first portion contacting the first source/drain region and a second portion contacting the second source/drain region. The dielectric pillar separates the first portion of the conductive layer from the second portion of the conductive layer.

In an embodiment, a structure includes a first fin structure and a second fin structure each extending above the substrate. A first source/drain region is disposed over a portion of the first fin structure, and a second source/drain region is disposed over a portion of the second fin structure. A dielectric pillar is disposed between the first and second source/drain regions. The dielectric pillar is arranged to wrap around a portion of the first source/drain region and a portion of the second source/drain region. A conductive layer has a first portion contacting the first source/drain region and a second portion contacting the second source/drain region. The first and second portions of the conductive layer are separated by the dielectric pillar.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 2A-12A and FIGS. 2B-12B are cross-sectional views at successive fabrication stages of the processing method subsequent to, respectively, FIG. 1A and FIG. 1B.

FIGS. 13A-16A and 13B-16B are cross-sectional views of the structure of FIGS. 1A and 1B at successive fabrication stages of an alternative processing method in accordance with embodiments of the invention.

DETAILED DESCRIPTION

Figure 1:
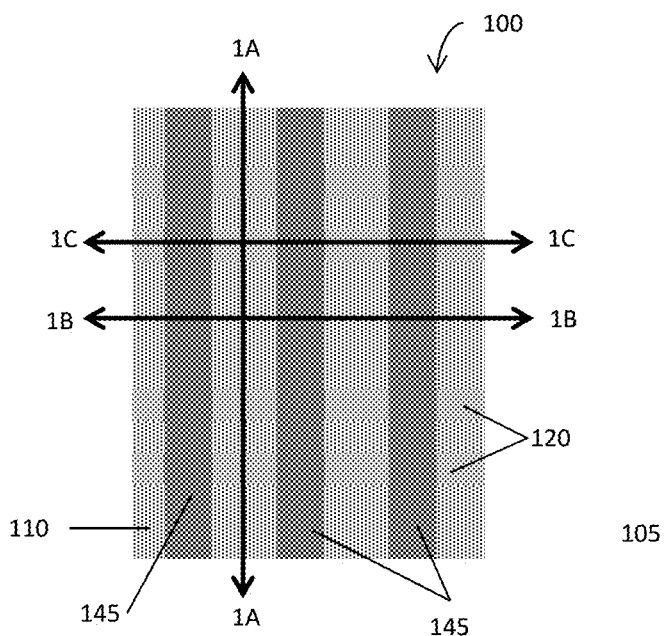
FIG. 1 is a top view of a structure at a fabrication stage of a processing method in accordance with embodiments of the invention.

With reference to FIGS. 1, 1A, 1B, and 1C and in accordance with embodiments of the invention, a structure 100 includes a substrate 105 and fin structures 120, 125 extending above the substrate, with a dielectric layer 110 disposed over the substrate 105 and between fin structures 120, 125. Structure 100 also includes temporary gate structures 140, 141, spacers 144 on sidewalls of temporary gate structures 140, 141, and a hardmask layer 145 disposed over upper surfaces of dummy or temporary gate structures 140, 141. Spacers 144 and hardmask layer 145 may be composed of the same dielectric material, such as silicon nitride, or may be composed of different materials; for simplicity and clarity in the figures, the hardmask layer 145 and spacers 144 are depicted throughout as being composed of the same material. Substrate 105 may be a semiconductor substrate, such as a silicon wafer, and fin structures 120, 125 may be formed from the substrate 105 by, for example, a lithography and etching. Fin structures 120, 125 may include a plurality of semiconductor fins extending above the substrate 105, and may be composed of the same material as substrate 105 or may include other materials, such as germanium or other semiconductor materials. Fin structures 120, 125 may be formed, for example, by a self-aligned double patterning (SADP) process, a self-aligned quadruple patterning (SAQP) process, or other fin formation process. The dielectric layer 110 may be composed, for example, of an oxide of silicon such as silicon dioxide. Temporary gate structures 140, 141 may be composed of sacrificial materials, such as an amorphous silicon layer and a thin underlying oxide layer, and hardmask layer 145 may be composed of a dielectric material, such as silicon nitride, SiOCN, etc.

Figure 1A:
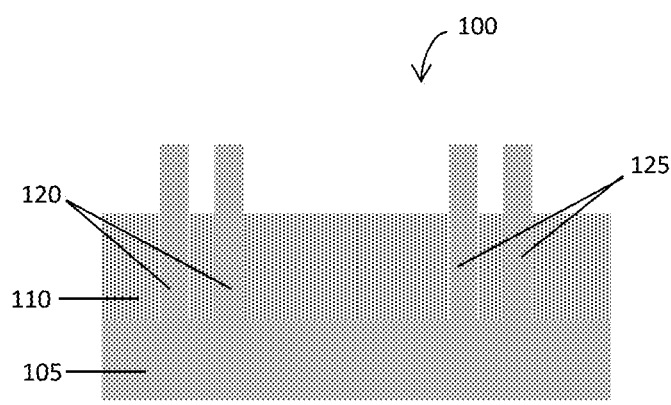
FIG. 1A is a cross-sectional view of taken generally along line 1A-1A in FIG. 1.
Figure 1B:
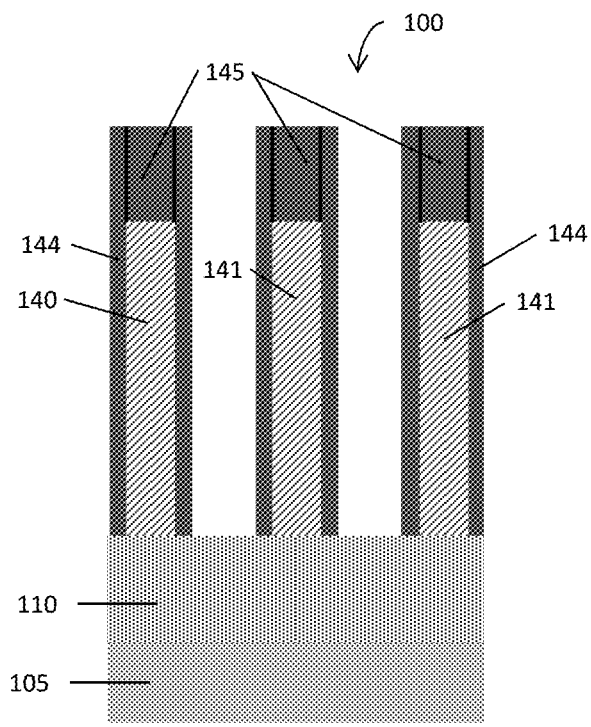
FIG. 1B is a cross-sectional view of taken generally along line 1B-1B in FIG. 1.
Figure 1C:
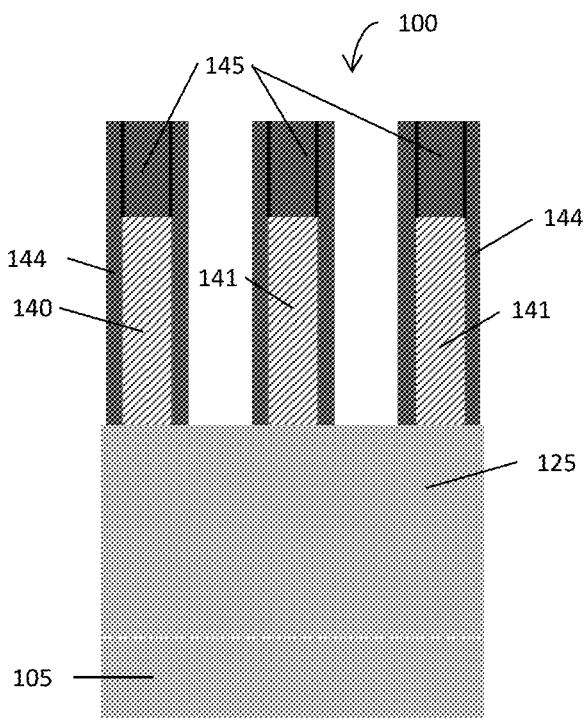
FIG. 1C is a cross-sectional view of taken generally along line 1C-1C in FIG. 1.
Figure 2A:
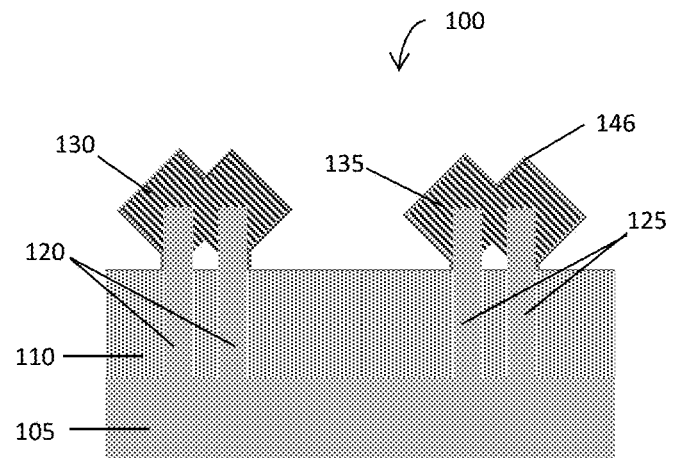
Figure 2B:
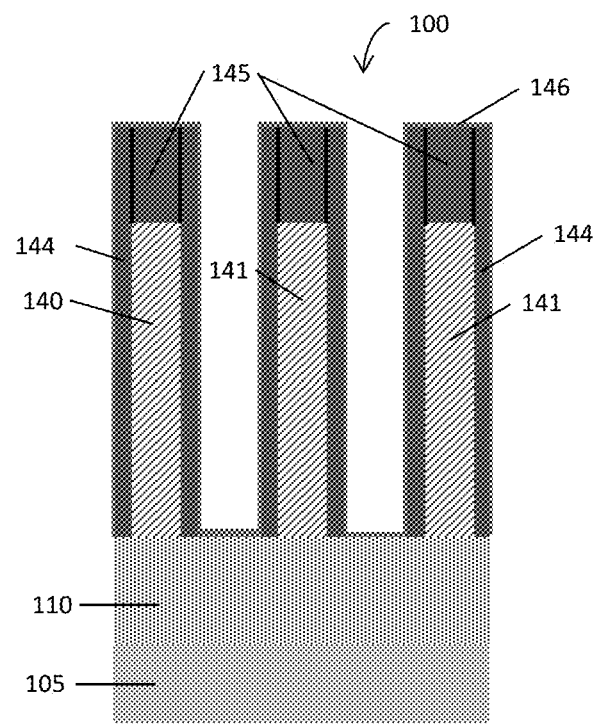

With reference to FIGS. 2A and 2B in which like reference numerals refer to like features in FIGS. 1A and 1B, respectively, and at a subsequent fabrication stage of the processing method, source/drain regions 130, 135 are formed over portions of fin structures 120, 125. Each source/drain region 130, 135 is formed adjacent to one or more of the temporary gate structures 140, 141 and extends above the dielectric layer 110. Source/drain regions 130, 135 may be formed, for example, by epitaxial growth of a semiconductor material from fin structures 120, 125. The semiconductor material over fin structures 120, 125 merges during epitaxial growth to form source/drain regions 130, 135. A portion of dielectric layer 110 is adjacent to source/drain region 130 and adjacent to source/drain region 135, and is therefore disposed between source/drain regions 130 and 135. A dielectric liner 146, such as a silicon nitride liner, may be deposited over structure 100 following formation of source/drain regions 130, 135.

Figure 3A:
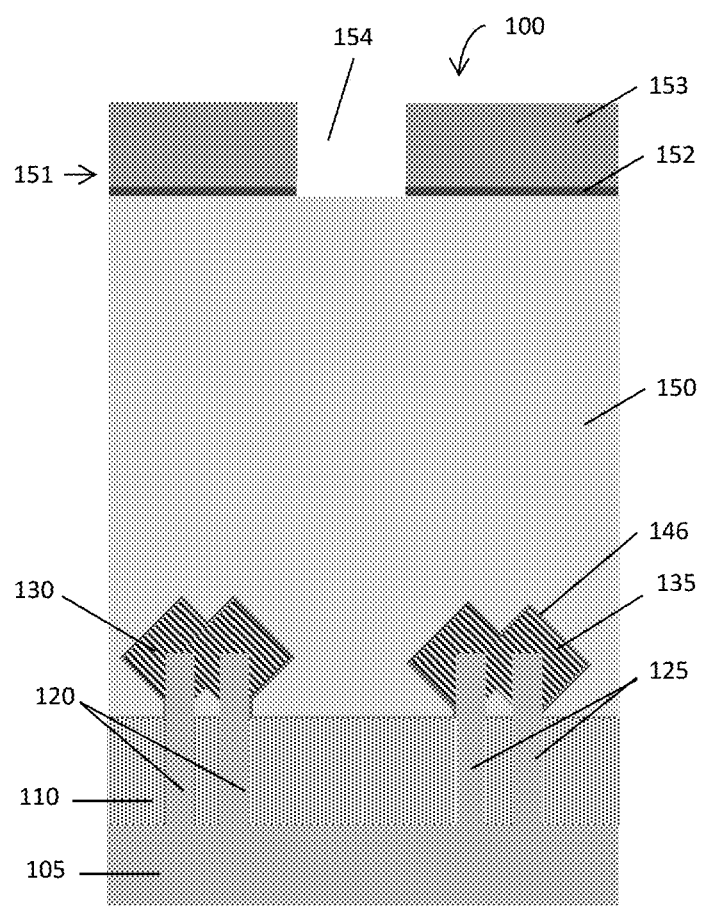
Figure 3B:
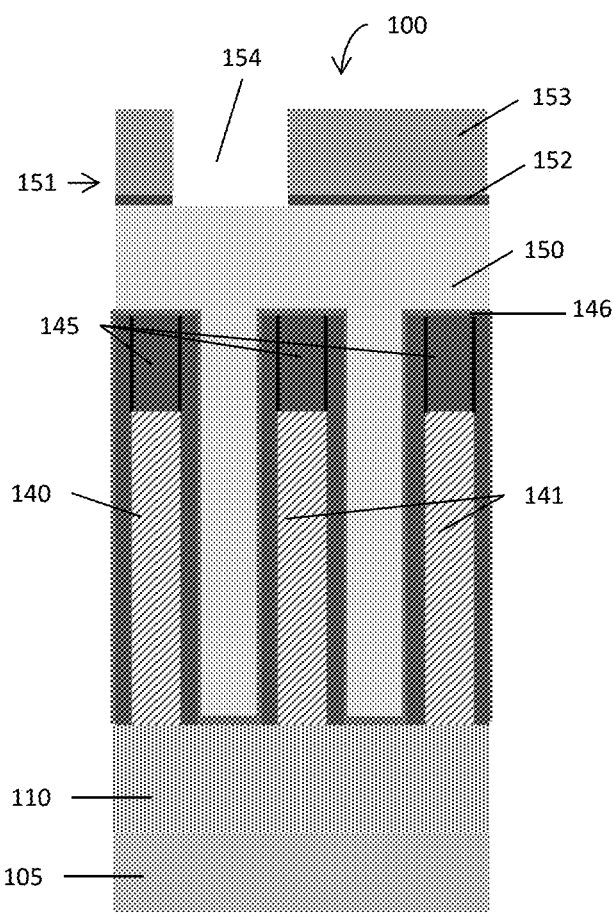

With reference to FIGS. 3A and 3B in which like reference numerals refer to like features in FIGS. 2A and 2B and at a subsequent fabrication stage of the processing method, a sacrificial layer 150 is formed over source/drain regions 130, 135 and dielectric layer 110. A lithography stack 151 is formed on the sacrificial layer 150 that includes one or more openings 154 that expose a portion of sacrificial layer 150. Sacrificial layer 150 may be composed of, for example, an organic planarization layer (OPL). Lithography stack 151 may include a plurality of lithographic etch layers, such as an anti-reflective coating (ARC) layer 152 and a patterned resist layer 153. The anti-reflective coating layer 152 may be composed, in one example, of silicon dioxide deposited by a low-pressure chemical-vapor deposition (LPCVD) process, or low temperature oxidation (LTO). In other examples, the anti-reflective coating layer 152 may be composed of silicon oxynitride, titanium oxide, or other suitable anti-reflective coating material. Opening 154 in lithography stack 151 corresponds to a space between source/drain regions 130, 135 in which a dielectric pillar is to be formed, as described further below.

Figure 4A:
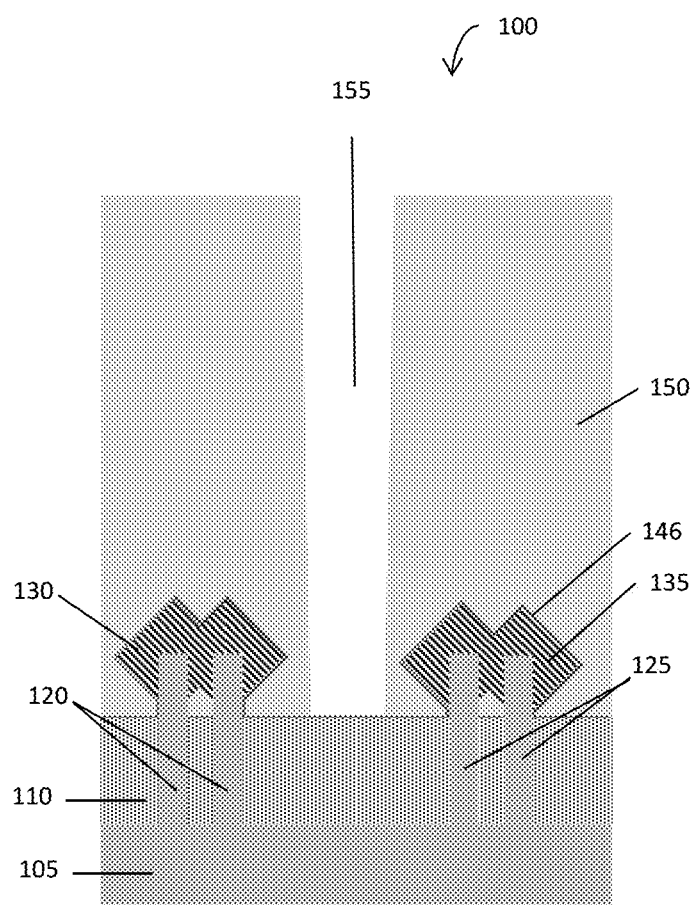
Figure 4B:
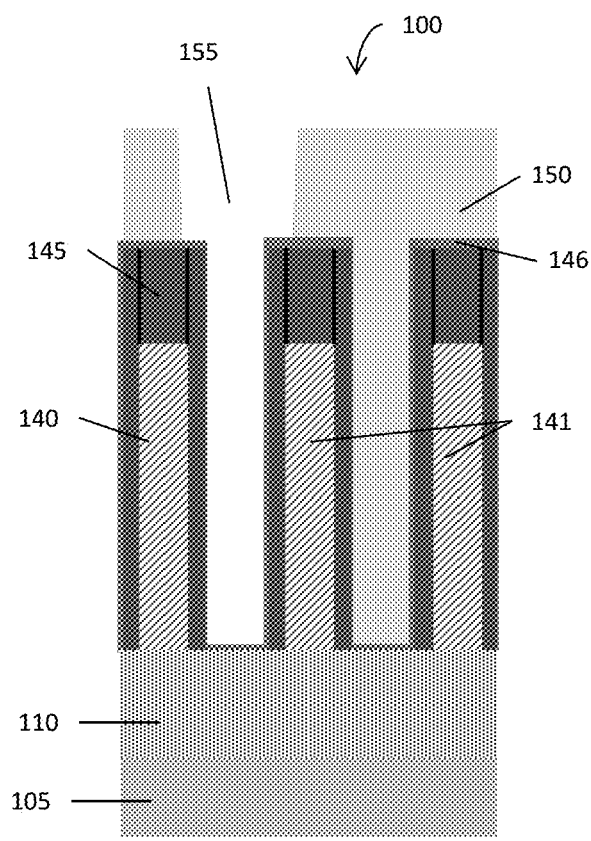

With reference to FIGS. 4A and 4B in which like reference numerals refer to like features in FIGS. 3A and 3B and at a subsequent fabrication stage of the processing method, a trench 155 is etched in the sacrificial layer 150 between source/drain region 130 and source/drain region 135. The etching may be a selective etch process that is controlled to remove the exposed portion of sacrificial layer 150 and to terminate on the material of the dielectric liner 146. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In conventional fabrication processes, a trench is generally formed in an interlayer dielectric (ILD) material, such as silicon dioxide, and the trench is subsequently filled to form a pillar between the source/drain regions. Such conventional processes, however, generally require etching processes, such as wet etching techniques, that do not have a sufficiently high etch selectivity for the ILD material; that is, other portions of the structure are damaged by the etch process as the ILD material is removed. Etching trench 155 in sacrificial layer 150, however, allows for greater etch selectivity of the sacrificial layer 150 material relative to other materials and structures of structure 100. Additionally, as further described below, remaining portions of the sacrificial layer 150 may be easily etched and removed after dielectric pillar 165 has been formed in trench 155. Following formation of trench 155, the patterned resist layer 153 is stripped and the anti-reflective coating layer 152 is removed from over sacrificial layer 150, along with any additional layers of lithography stack 151.

Figure 5A:
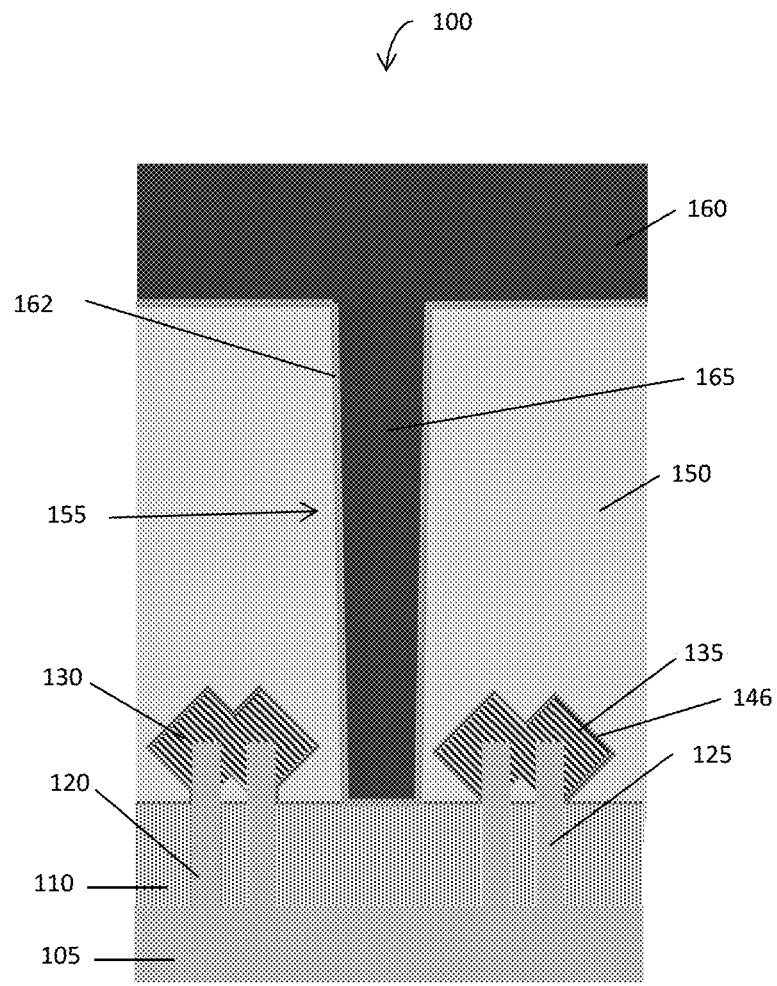
Figure 5B:
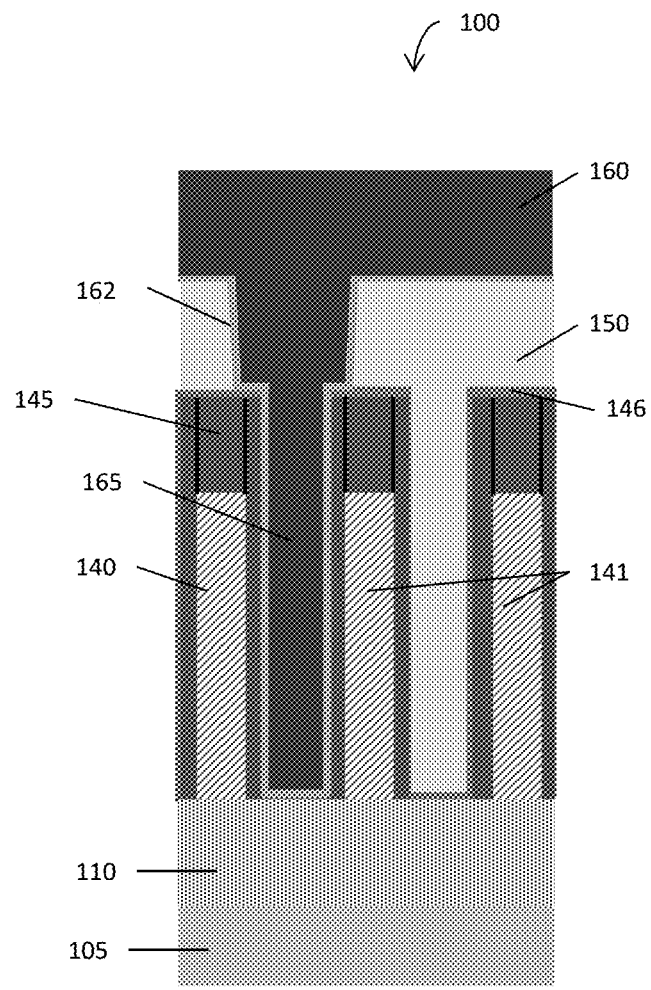

With reference to FIGS. 5A and 5B in which like reference numerals refer to like features in FIGS. 4A and 4B and at a subsequent fabrication stage of the processing method, a dielectric material 160 is deposited over structure 100 to fill trench 155 and form a dielectric pillar 165. A dielectric liner 162 may also be formed on sidewalls of trench 155, as well as over a top surface of sacrificial layer 150, prior to deposition of dielectric material 160. Dielectric material 160 may be, for example, composed of an oxide of silicon, and the dielectric liner 162 may be composed, for example, a nitride of silicon.

Figure 6A:
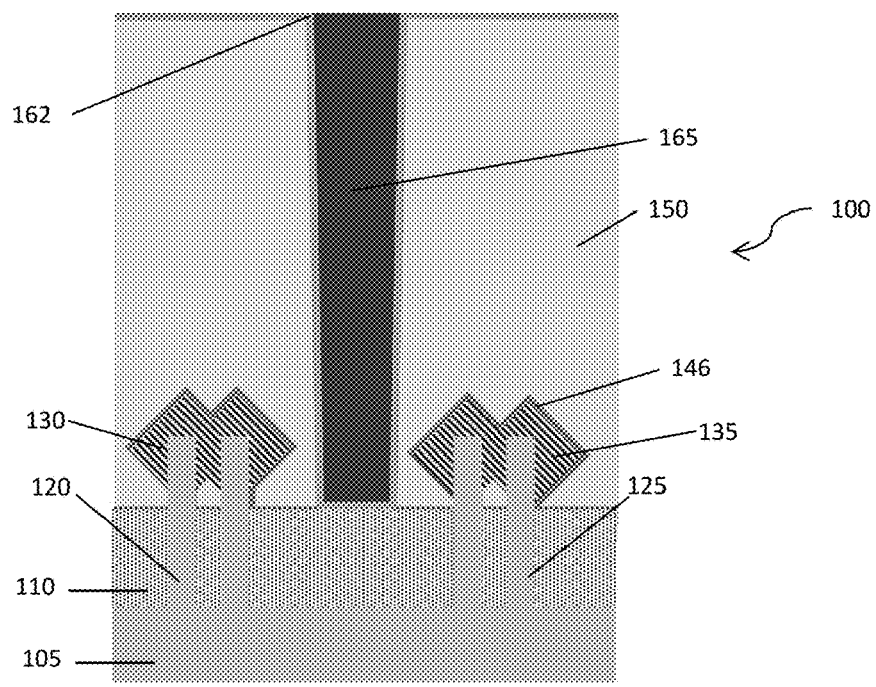
Figure 6B:
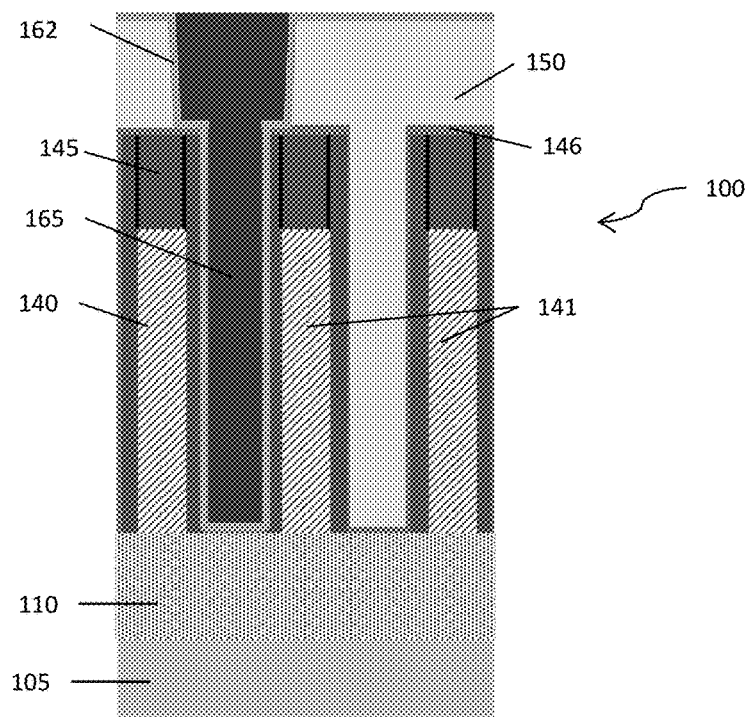

With reference to FIGS. 6A and 6B in which like reference numerals refer to like features in FIGS. 5A and 5B and at a subsequent fabrication stage of the processing method, dielectric material 160 is polished, leaving dielectric pillar 165 in place over dielectric layer 110 and between source/drain regions 130, 135. Dielectric material 160 may be polished, for example, by a chemical-mechanical planarization (CMP) process that stops on dielectric liner 162.

Figure 7A:
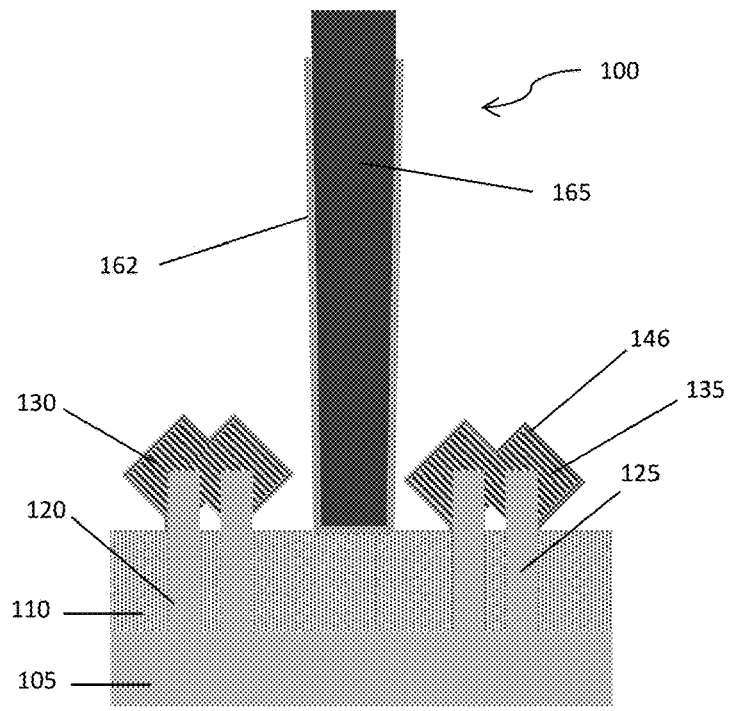
Figure 7B:
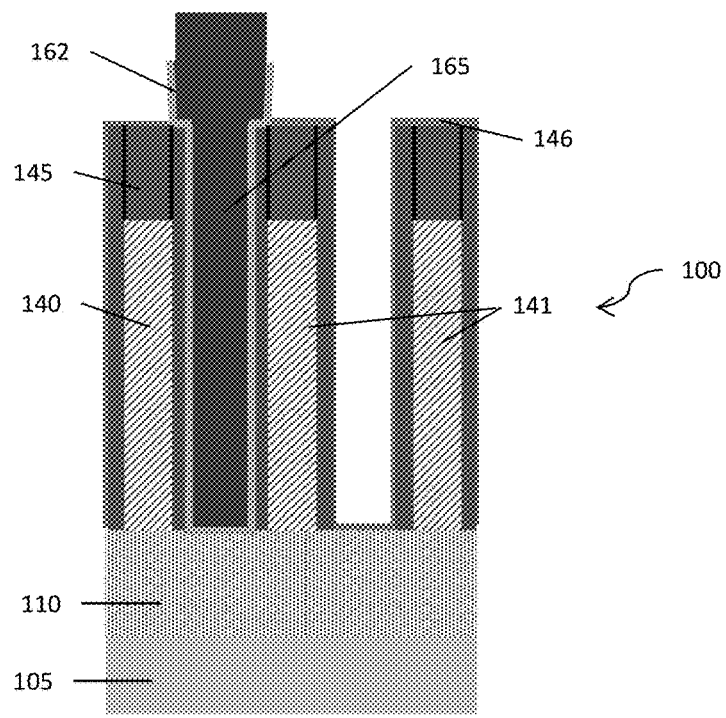

With reference to FIGS. 7A and 7B in which like reference numerals refer to like features in FIGS. 6A and 6B and at a subsequent fabrication stage of the processing method, the dielectric liner 162 is etched and removed from over remaining portions of sacrificial layer 150, and the remaining portions of sacrificial layer 150 are removed, leaving the dielectric pillar 165 in place. The dielectric liner 162 may be etched, for example, by a reactive-ion etch (RIE) process controlled to terminate after a selected time period has elapsed.

Figure 8A:
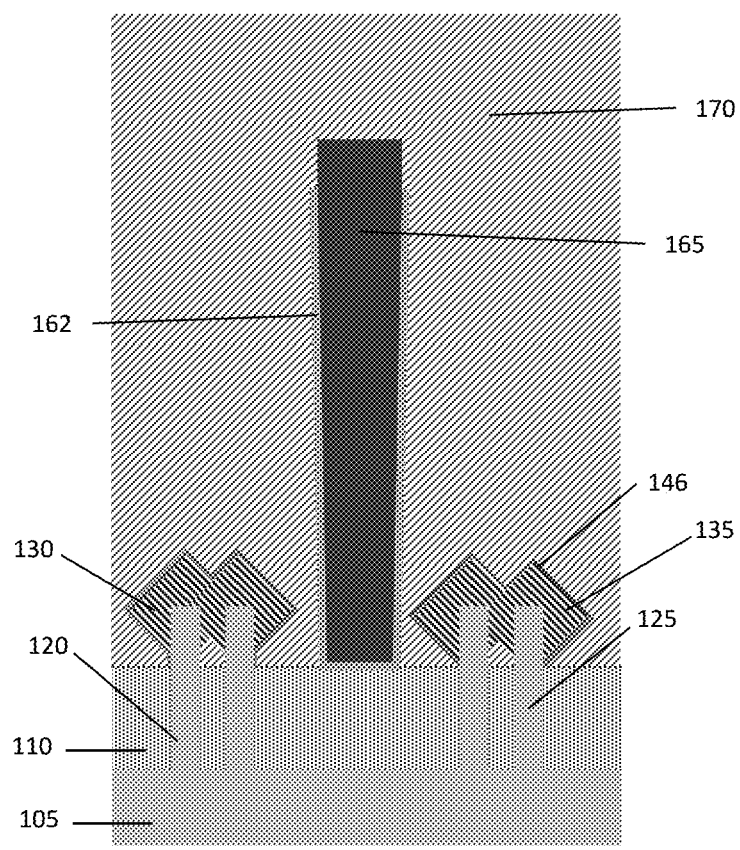
Figure 8B:
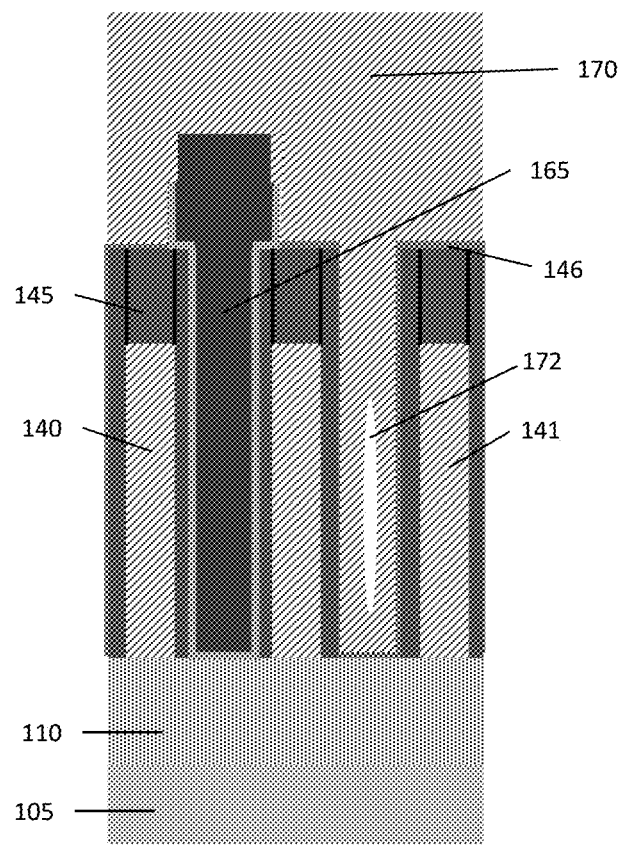

With reference to FIGS. 8A and 8B in which like reference numerals refer to like features in FIGS. 7A and 7B and at a subsequent fabrication stage of the processing method, a sacrificial fill layer 170 is deposited over source/drain regions 130, 135 and other portions of structure 100. The fill layer 170 may be composed of amorphous silicon ($\alpha$-Si), for example. Amorphous silicon may be commonly used as a fill layer in many fabrication processes, although amorphous silicon as a fill layer may leave voids 172 over portions of structure 100, such as over a source/drain regions 130, 135. In other fabrication processes, such voids 172 may subsequently trap deposited dielectric material, causing issues with subsequently opening the spaces over the source/drain regions 130, 135 and thus precipitating issues with subsequent trench silicidation steps during contact formation. In the processes described herein, however, any voids 172 in the fill layer 170 may be insignificant because such voids 172 are not exposed to a dielectric material and the fill layer 170 may be removed completely following replacement of temporary gate structures 140, 141 with replacement gate structures as described below, allowing for complete removal of the fill layer 170.

Figure 9A:
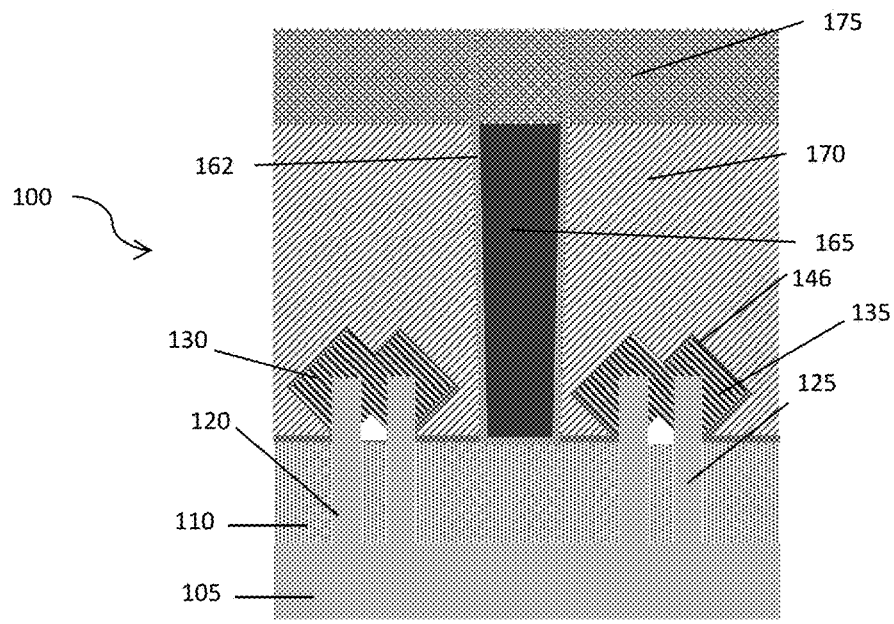
Figure 9B:
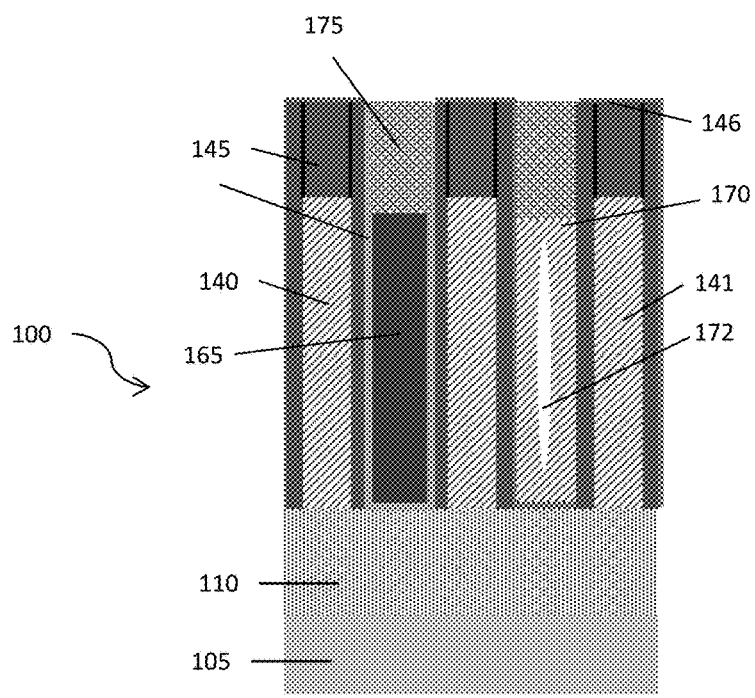

With reference to FIGS. 9A and 9B in which like reference numerals refer to like features in FIGS. 8A and 8B and at a subsequent fabrication stage of the processing method, the fill layer 170 and dielectric pillar 165 are planarized to be co-planar with top surfaces of hardmask layer 145 and then recessed below top surfaces of temporary gate structures 140, 141. A dielectric cap layer 175 is then deposited over the fill layer 170 and over the dielectric pillar 165. The fill layer 170 and dielectric pillar 165 may be planarized in a single chemical mechanical planarization step or may be planarized separately in multiple planarization steps. The dielectric pillar 165 may be recessed before the fill layer 170 is recessed, or the fill layer 170 may be recessed prior to recessing the dielectric pillar 165. Dielectric cap layer 175 may be deposited, for example, by a high-density plasma (HDP) deposition process, such as an HDP-CVD process. The dielectric cap layer 175 may be, for example, composed of an oxide-based dielectric material.

Figure 10A:
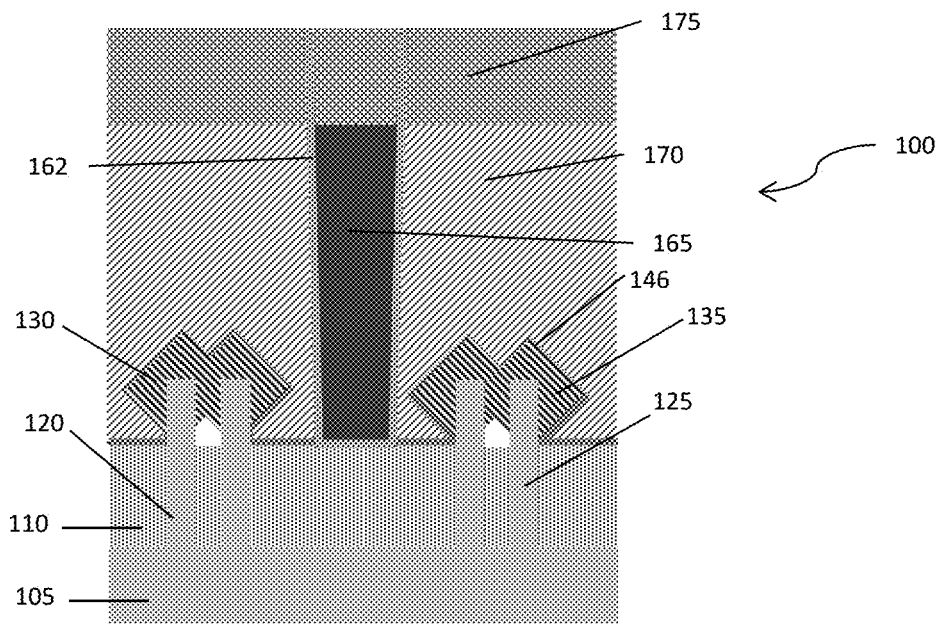
Figure 10B:
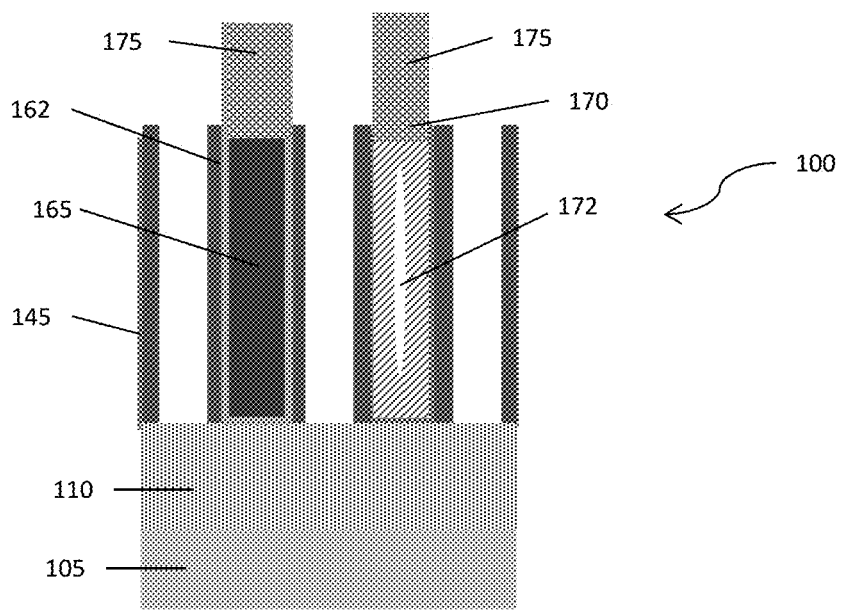

With reference to FIGS. 10A and 10B in which like reference numerals refer to like features in FIGS. 9A and 9B and at a subsequent fabrication stage of the processing method, the hardmask layer 145 is removed to expose temporary gate structures 140, and temporary gate structures 140 are removed. The hardmask layer 145 may be etched or planarized in a controlled process that is controlled to terminate when temporary gate structures 140, 141 are exposed. Dielectric cap layer 175 protects the dielectric pillar 165 and fill layer 170 from being damaged or removed as the temporary gate structures 140, 141 are being removed.

Figure 11A:
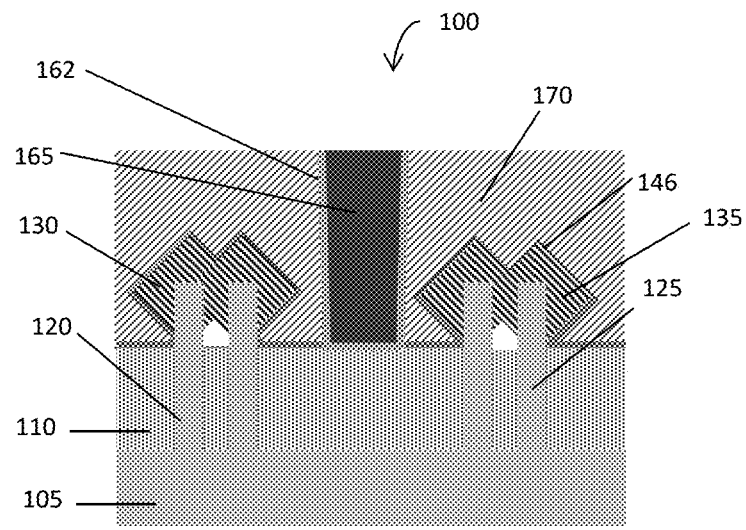
Figure 11B:
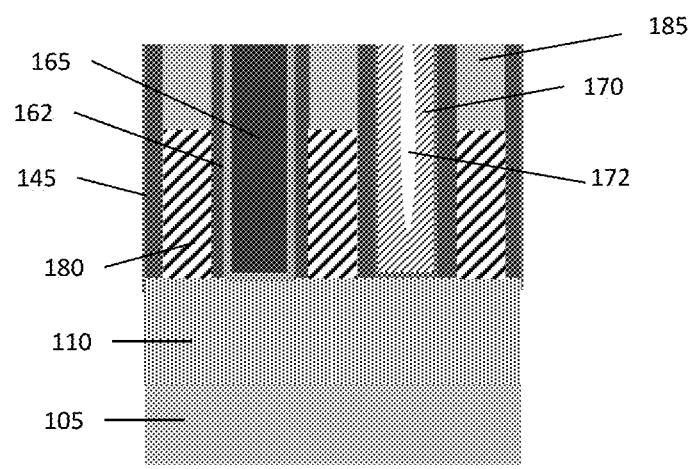

With reference to FIGS. 11A and 11B in which like reference numerals refer to like features in FIGS. 10A and 10B and at a subsequent fabrication stage of the processing method, functional gate structures 180 are formed to replace the temporary gate structures 140 and the functional gate structures 180 are capped with a dielectric gate cap material 185. The functional gate structures 180 may be metal gate structures that include a conformal gate dielectric, such as a high-k dielectric like hafnium oxide ($HfO_2$), and one or more conformal barrier metal layers and/or work function metal layers, such as layers composed of titanium aluminum carbide (TiAlC) and/or titanium nitride (TiN), and a metal gate fill layer composed of a conductor, such as tungsten (W). Following formation of functional gate structures 180, the dielectric pillar 165, fill layer 170, hardmask layer 145 and dielectric gate cap material 185 may be planarized by, for example, a chemical-mechanical planarization (CMP) process. The temporary gate structures 140 represent placeholder structures that are replaced by functional gate structures 180. The functional gate structures 180 may be used to control output current (i.e., flow of carriers in the channel) of a field-effect transistor.

Figure 12A:
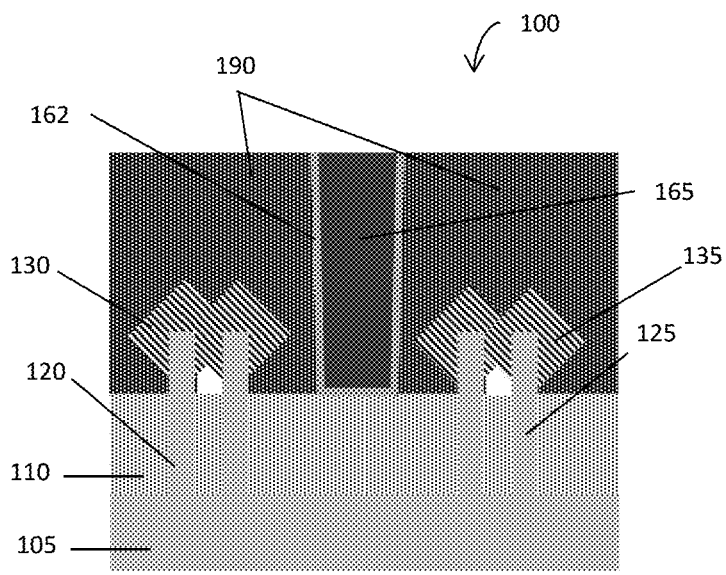
Figure 12B:
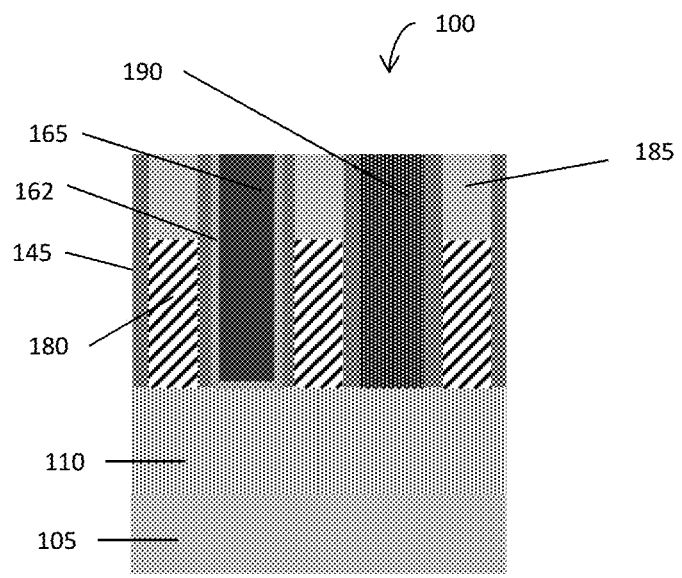

With reference to FIGS. 12A and 12B in which like reference numerals refer to like features in FIGS. 11A and 11B and at a subsequent fabrication stage of the processing method, fill layer 170 is removed, and a conductive layer 190 is formed over source/drain regions 130, 135. Fill layer 170 may be removed, for example, by a selective wet etch process that removes all exposed fill layer 170 to fully open and expose the source/drain regions 130, 135. The dielectric liner 146 may also be removed after fill layer 170 is removed, prior to deposition of the conductive layer 190. The dielectric liner 146 may, in alternative embodiments of the processes described herein, be removed from over source/drain regions 130, 135 during earlier processing steps, such as prior to the deposition of fill layer 170 as described above. The conductive layer 190 includes a portion in contact with source/drain region 130 and another portion in contact with the other source/drain region 135, with the two portions of the conductive layer 190 separated by the dielectric pillar 165. The conductive layer 190 may be a conductor formed, for example, via a silicidation process, and the different portions of the conductive layer 190 may provide respective contacts with the source/drain region 130, 135.

As described above in connection with FIGS. 2A-12A and 2B-12B, the dielectric pillar 165 is formed prior to depositing the fill layer 170 and accordingly before replacing the temporary gate structures 140, 141 with functional gate structures 180. As illustrated in FIGS. 13A-16A and 13B-16B and in alternative embodiments, however, the functional gate structures 180 may be formed first and the fill layer 170 removed prior to forming the dielectric pillar 165, as described further below.

Figure 13A:
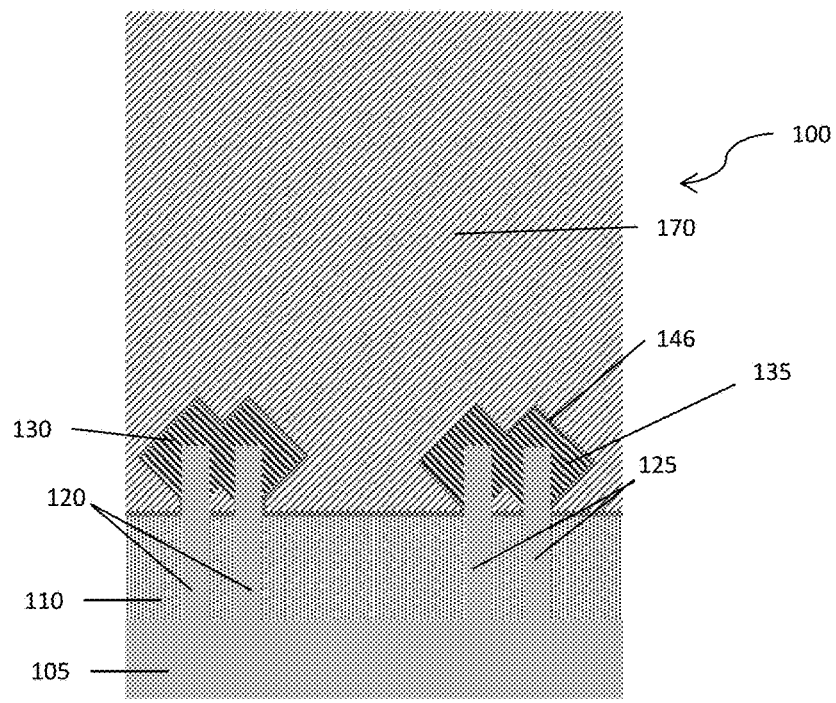
Figure 13B:
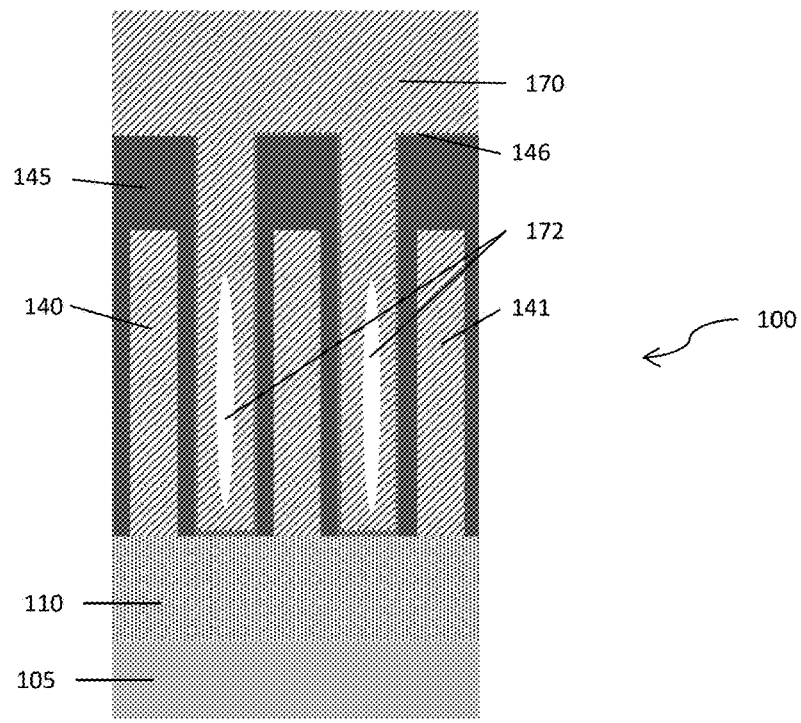

With reference to FIGS. 13A and 13B in which like reference numerals refer to like features in FIGS. 2A and 2B, respectively, and at a subsequent fabrication stage of the processing method, a fill layer 170 is deposited over source/drain regions 130, 135 and other portions of structure 100. The fill layer 170 may be composed of amorphous silicon ($\alpha$-Si), for example. As described above, voids 172 may form in fill layer 170.

Figure 14A:
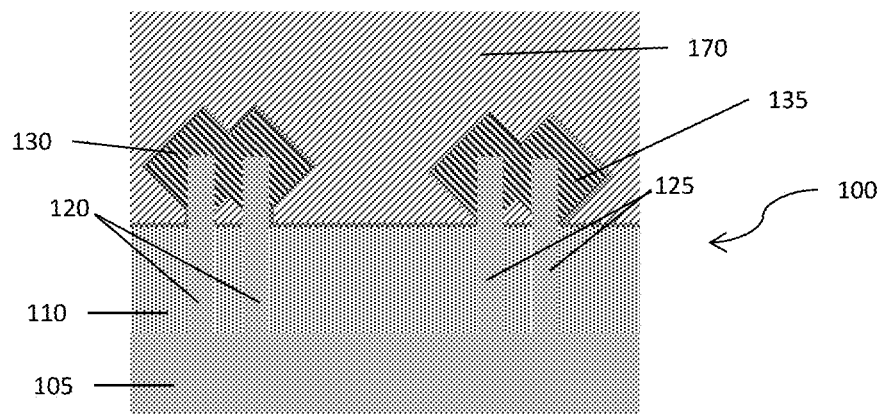
Figure 14B:
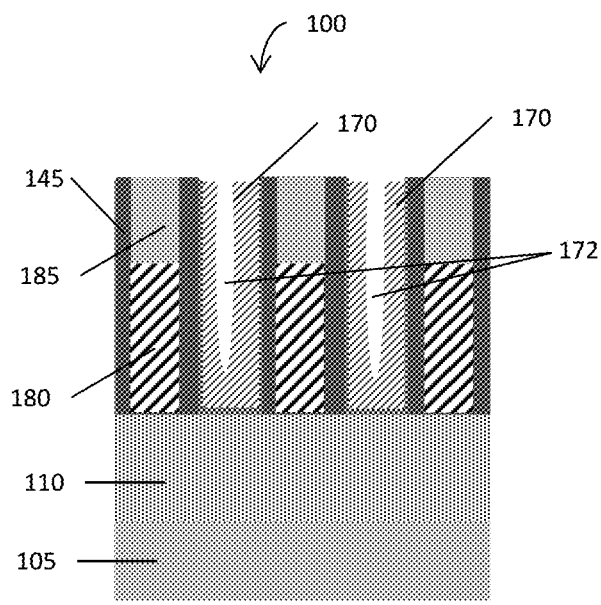

With reference to FIGS. 14A and 14B in which like reference numerals refer to like features in FIGS. 13A and 13B and at a subsequent fabrication stage of the processing method, the fill layer 170 is recessed, temporary gate structures 140 are removed, and functional gate structures 180 and dielectric gate cap material 185 are formed to replace the temporary gate structures 140,141. The processes for planarizing and recessing fill layer 170 may be similar to the processes described above with respect to FIGS. 9A and 9B, except that separate steps for planarizing and recessing the dielectric pillar 165 are not needed because the dielectric pillar 165 is formed after fill layer 170 has been removed, as further described below. Processes for forming functional gate structures 180 may be similar to the processes described above and illustrated in FIGS. 10A, 10B and 11A, 11B.

Figure 15A:
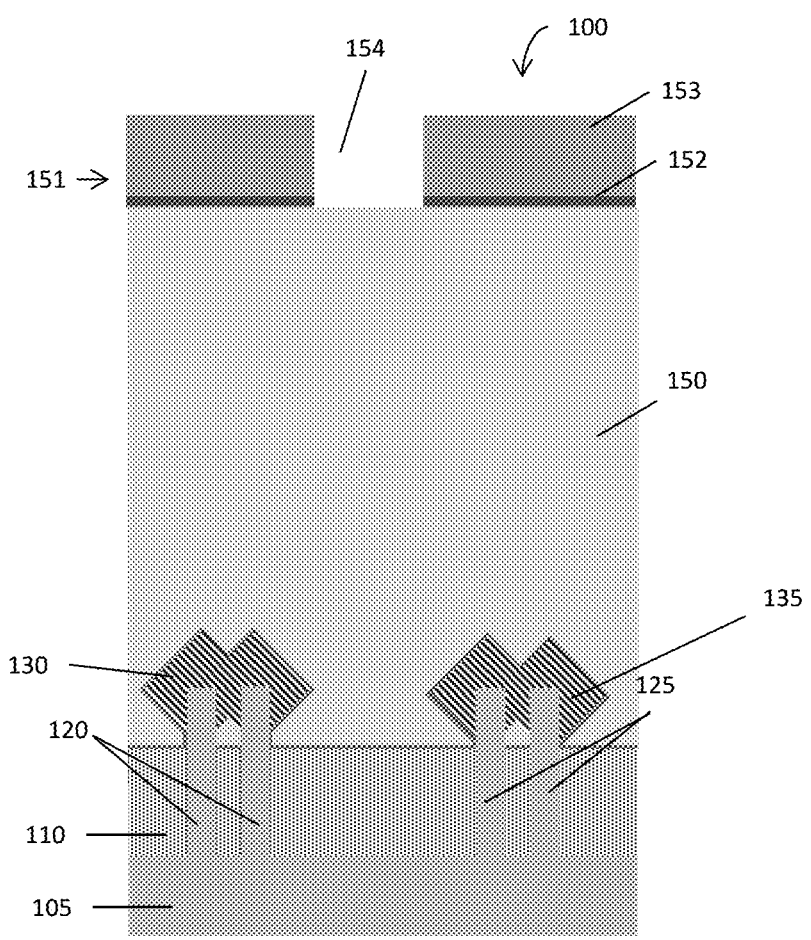
Figure 15B:
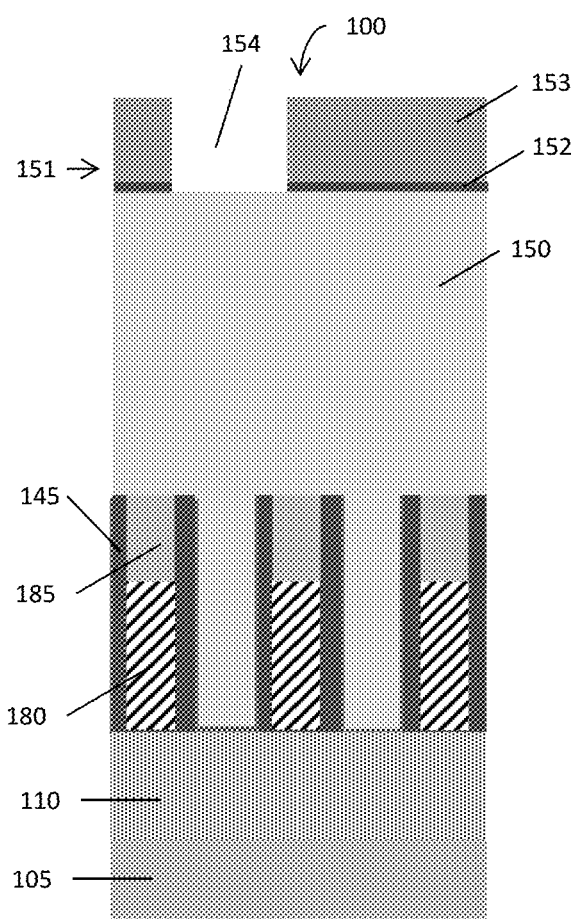

With reference to FIGS. 15A and 15B in which like reference numerals refer to like features in FIGS. 14A and 14B and at a subsequent fabrication stage of the processing method, after fill layer 170 has been completely removed from structure 100, sacrificial layer 150 is formed over source/drain regions 130, 135 and dielectric layer 110. Lithography stack 151 is formed on the sacrificial layer 150 that includes one or more openings 154 that expose a portion or portions of the sacrificial layer 150. Lithography stack 151 may include a plurality of lithographic etch layers, such as an anti-reflective coating layer 152 and a patterned resist layer 153. The anti-reflective coating layer 152 may be composed, in one example, of silicon dioxide deposited by a low-pressure chemical-vapor deposition (LPCVD) process, or LTO. In other examples, the anti-reflective coating layer 152 may be composed of silicon oxynitride, titanium oxide, or other suitable anti-reflective coating material. Opening 154 in lithography stack 151 corresponds to a space between source/drain regions 130, 135 where a dielectric pillar 165 is to be formed.

Figure 16A:
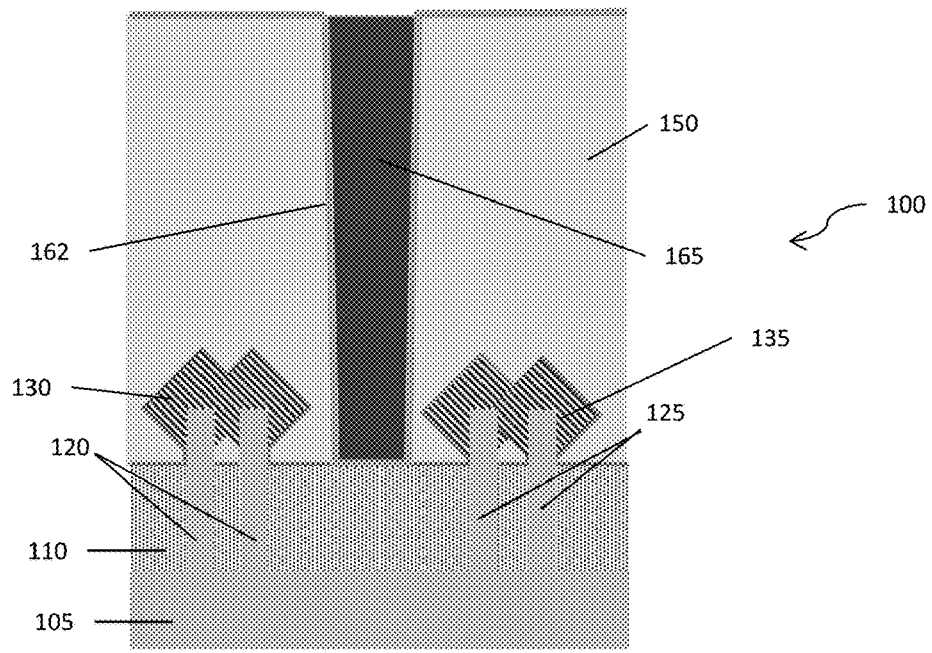
Figure 16B:
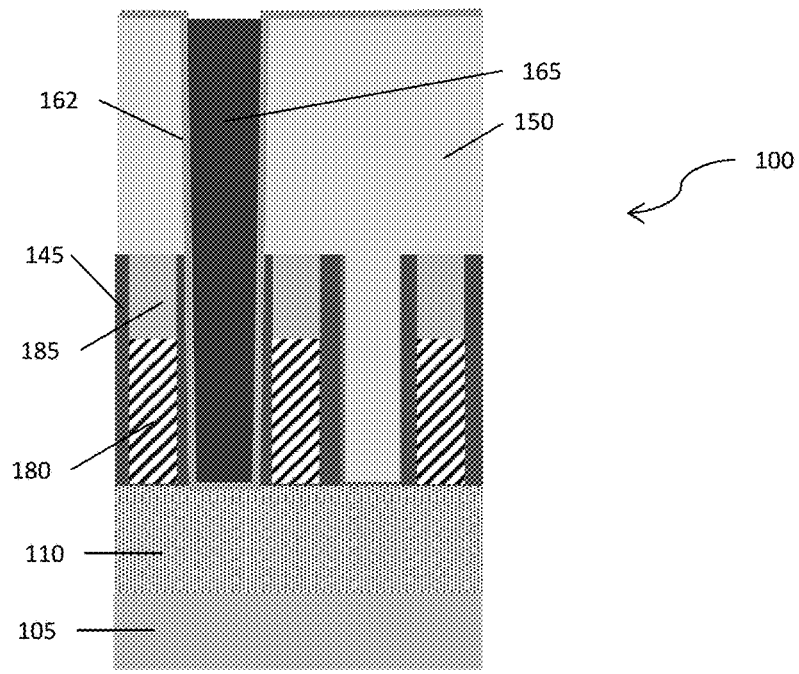

With reference to FIGS. 16A and 16B in which like reference numerals refer to like features in FIGS. 15A and 15B and at a subsequent fabrication stage of the processing method, the dielectric pillar 165 is formed. The process for forming dielectric pillar 165, as well as dielectric liner 162, may be similar to the process described and illustrated in FIGS. 4A-6A and 4B-6B. After the dielectric pillar 165 is formed, the lithography stack 151 and remaining sacrificial layer 150 can be removed as described and illustrated in FIG. 7A, and conductive layer 190 may be provided over source/drain regions 130, 135 as described above, resulting in the structure depicted in FIGS. 12A and 12B.

Figure 22:
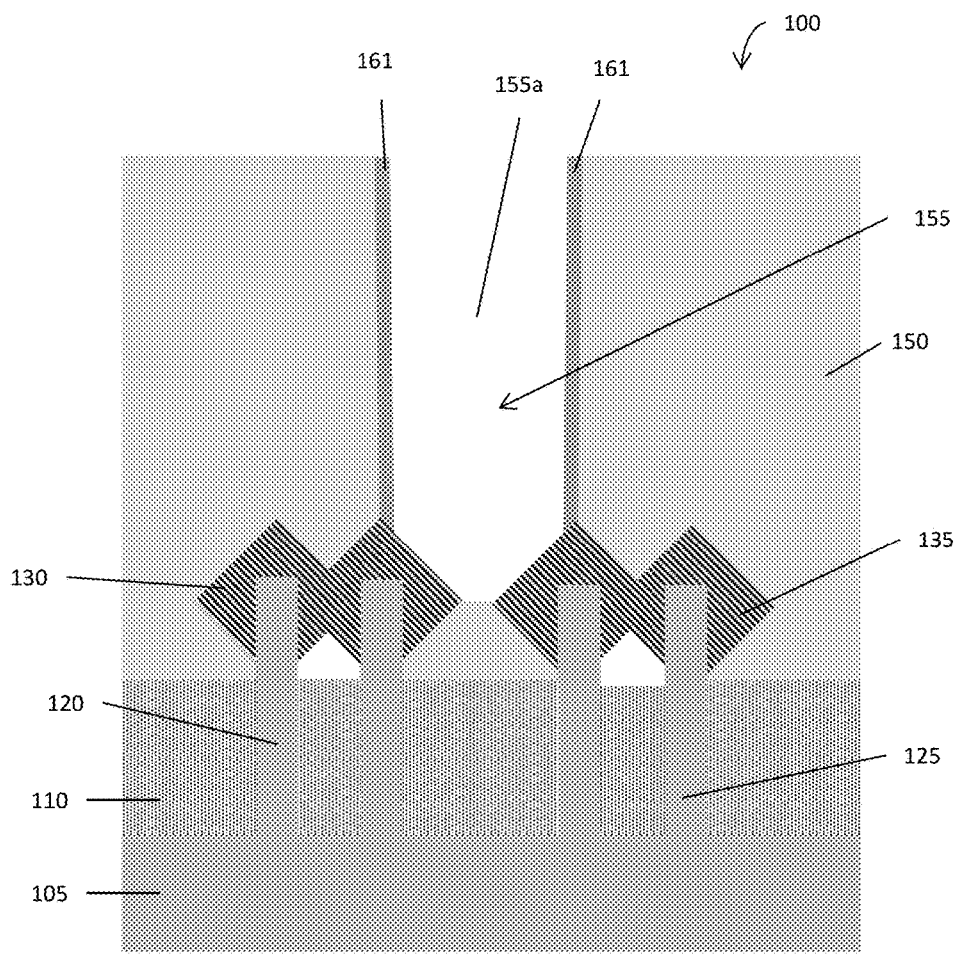
FIGS. 22-24 are cross-sectional views of a structure at successive additional fabrication stages of the processing method in accordance with embodiments of the invention.
Figure 23:
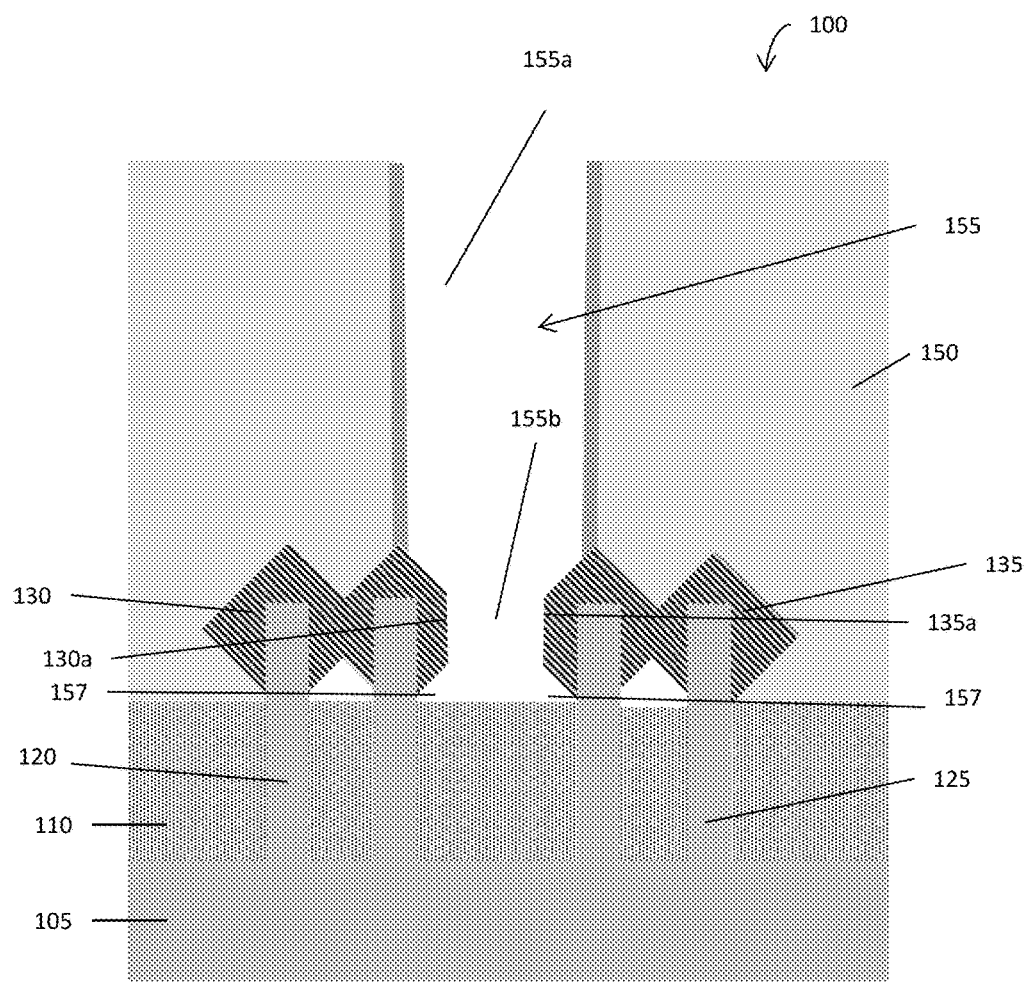
Figure 24:
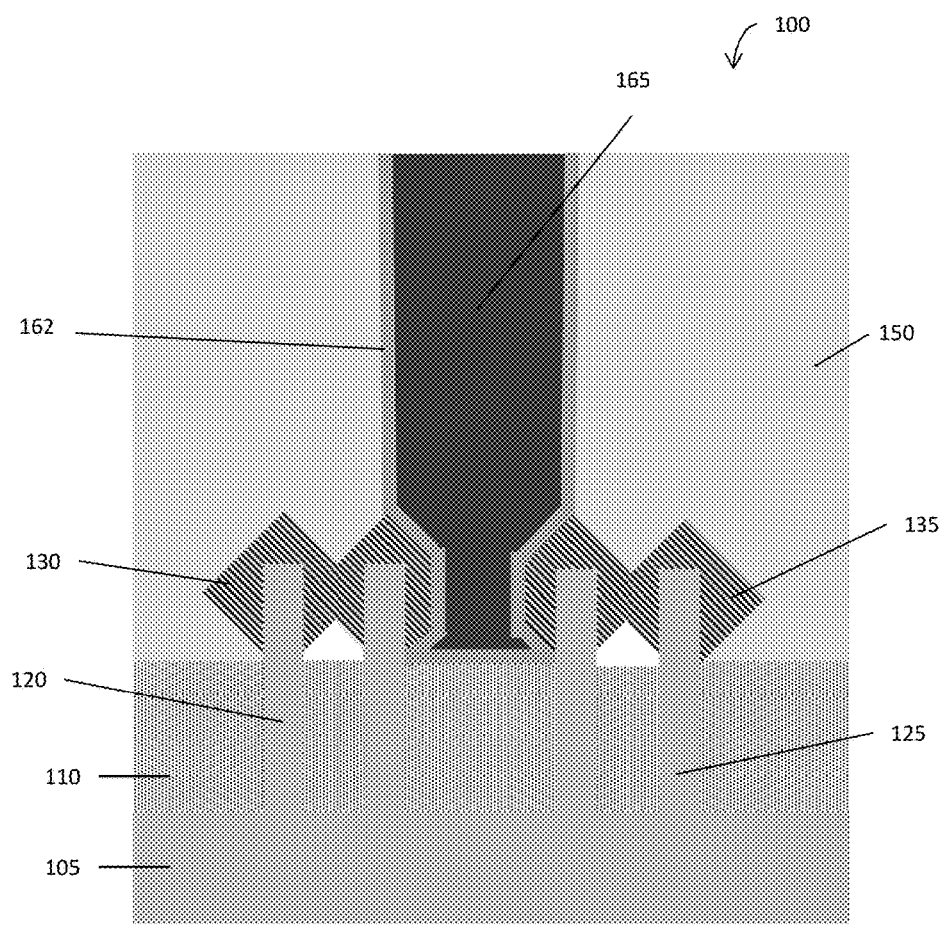

FIGS. 17-21 illustrate an alternative process in which trench 155 in sacrificial layer 150 is etched in multiple stages, rather than in a single etch step, and which may be applied where the spacing between source/drain region 130 and source/drain region 135 is smaller than a critical dimension of the trench 155 that can be feasibly formed in a patterned resist layer such as patterned resist layer 153. FIGS. 22-24 illustrate another alternative process in which trench 155 is etched in multiple stages, including a partial etch of portions of source/drain regions 130 and 135 which may be applied where spacing between source/drain regions 130 and 135 is so small as to otherwise prevent fully etching trench 155 and forming a dielectric pillar 165 that contacts dielectric layer 110. The processes illustrated in FIGS. 17-21 or FIGS. 22-24 may be applied whether the dielectric pillar 165 is formed prior to formation of functional gate structures 180 or formed after formation of functional gate structures 180, as described above.

Figure 17:
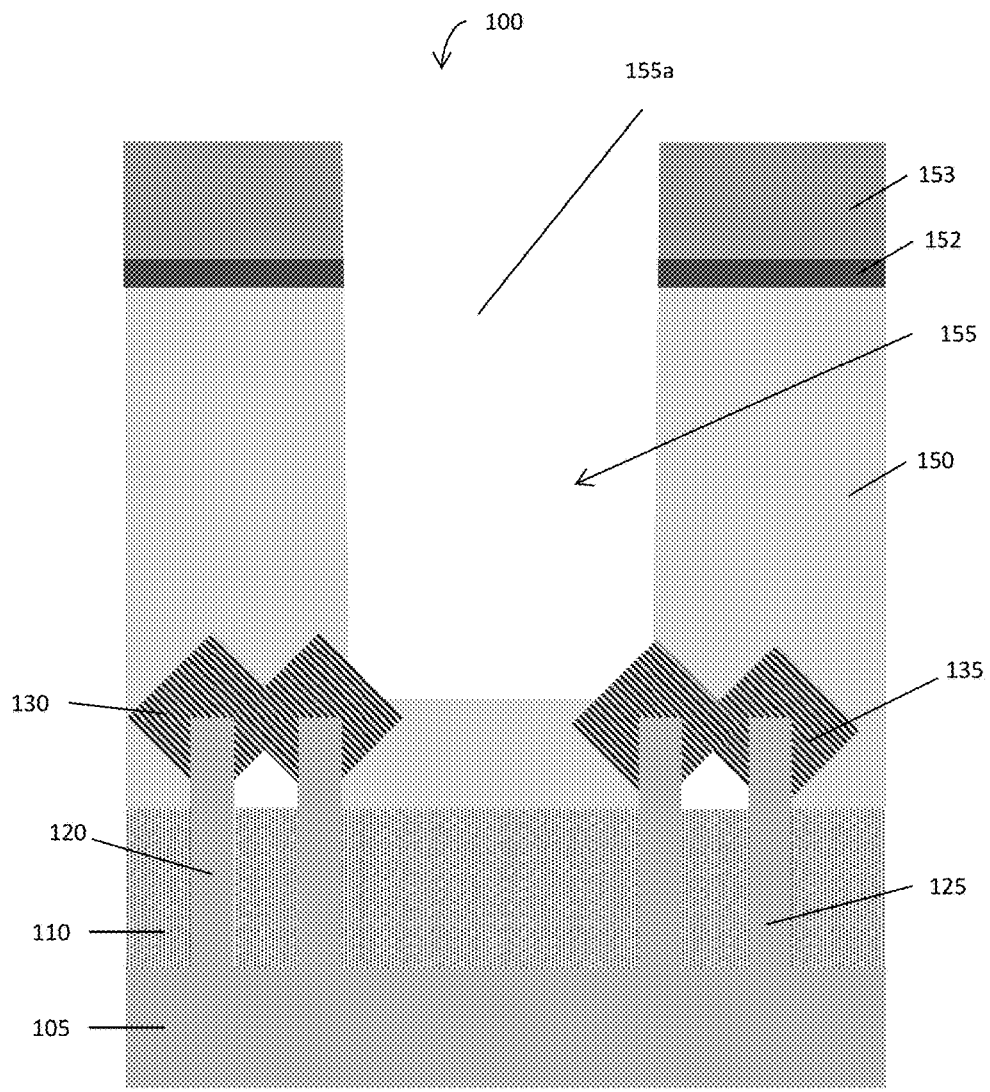
FIGS. 17-21 are cross-sectional views of a structure at successive additional fabrication stages of the processing method in accordance with embodiments of the invention.

With respect to FIG. 17 in which like reference numerals refer to like features in FIGS. 3A and 3B and FIGS. 16A and 16B and at a subsequent fabrication stage of either processing method, an upper portion 155a of trench 155 is etched in sacrificial layer 150 by, for example, a selective anisotropic RIE process. The upper portion 155a of trench 155 exposes a portion of source/drain region 130 and a portion of source/drain region 135. The etching of the upper portion 155a of trench 155 may be controlled to terminate after a pre-determined depth of trench 155 has been removed and a desired portion of source/drain regions 130, 135 has been exposed. Thus, FIG. 17 illustrates one example of a depth for upper portion 155a of trench 155, but the etch process may be adjusted to expose lesser or greater portions of source/drain regions 130, 135.

Figure 18:
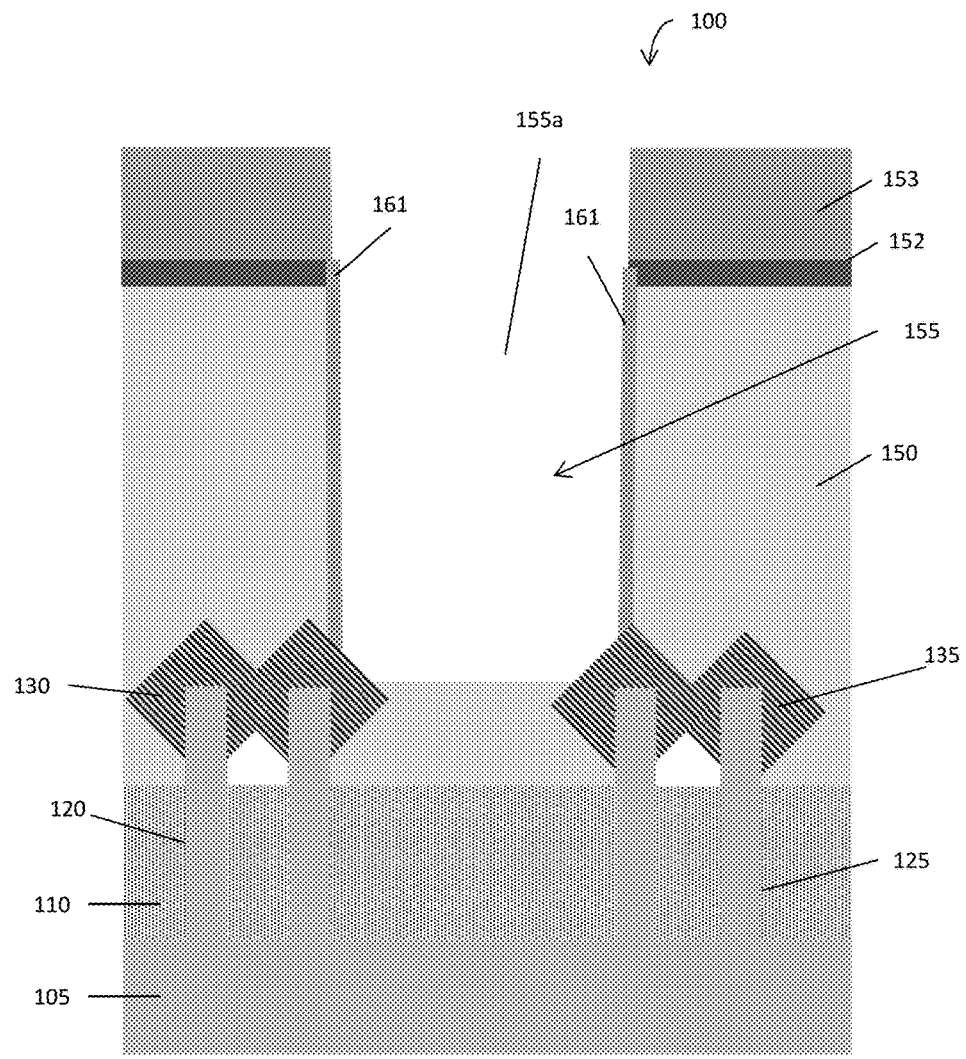

With respect to FIG. 18 in which like reference numerals refer to like features in FIG. 17 and at a subsequent fabrication stage of the processing method, dielectric spacers 161 are formed on the sacrificial layer 150 at the sidewalls of the upper portion 155a of the trench 155. The dielectric spacers 161 may be formed, for example, depositing a conformal layer of a dielectric material by plasma-assisted atomic-layer deposition (PEALD) followed by an anisotropic RIE process. Dielectric spacers 161 may be composed of, for example, a nitride-based dielectric material such as silicon nitride.

Figure 19:
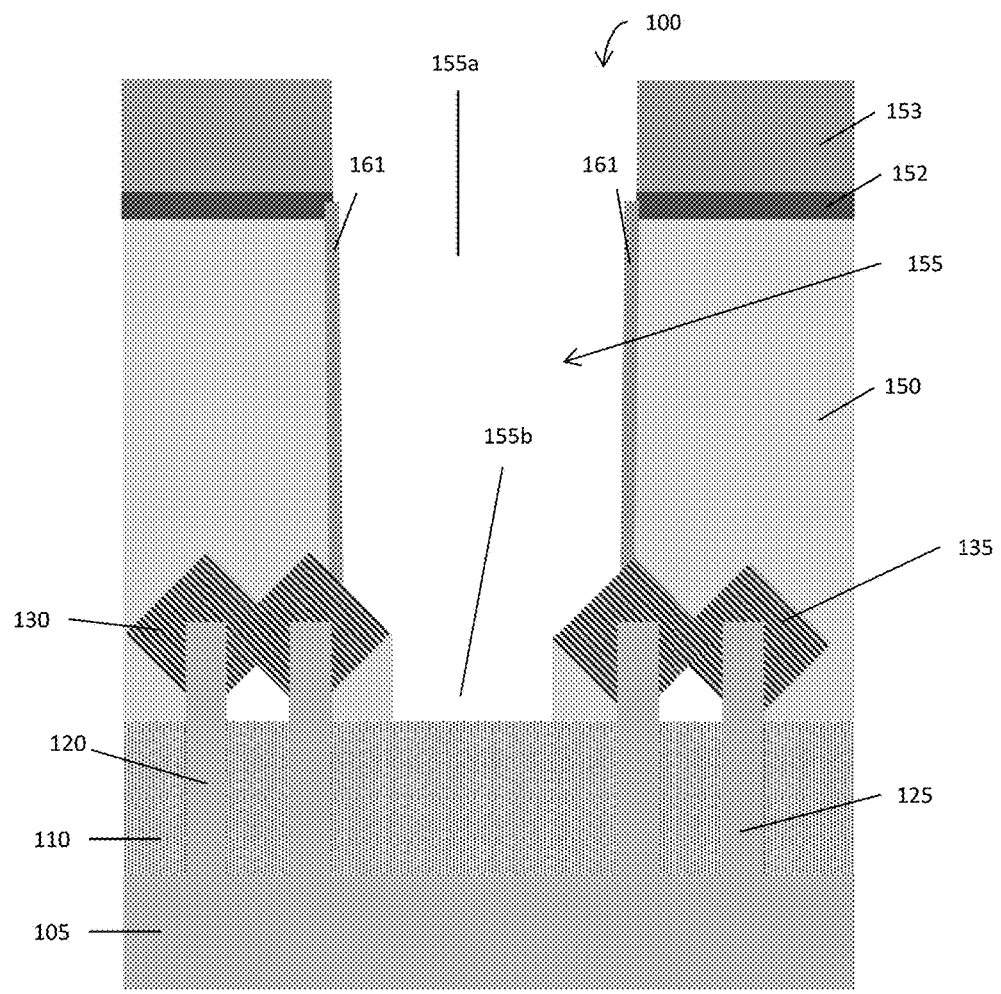

With respect to FIG. 19 in which like reference numerals refer to like features in FIG. 18 and at a subsequent fabrication stage of the processing method, the sacrificial layer 150 is etched with an anisotropic ME process to form a lower portion 155b of trench 155 after the dielectric spacers 161 are formed. In alternative embodiments, the lower portion 155b of trench 155 may be etched by an isotropic ME process, which may remove remaining portions of sacrificial layer 150 beneath source/drain regions 130 and 135 to provide the structure of FIG. 20. Dielectric spacers 161 protect portions of sacrificial layer 150 over source/drain regions 130, 135 that are to remain unetched for formation of dielectric pillar 165 such that the size of the upper portion 155a of trench 155 is preserved.

Figure 20:
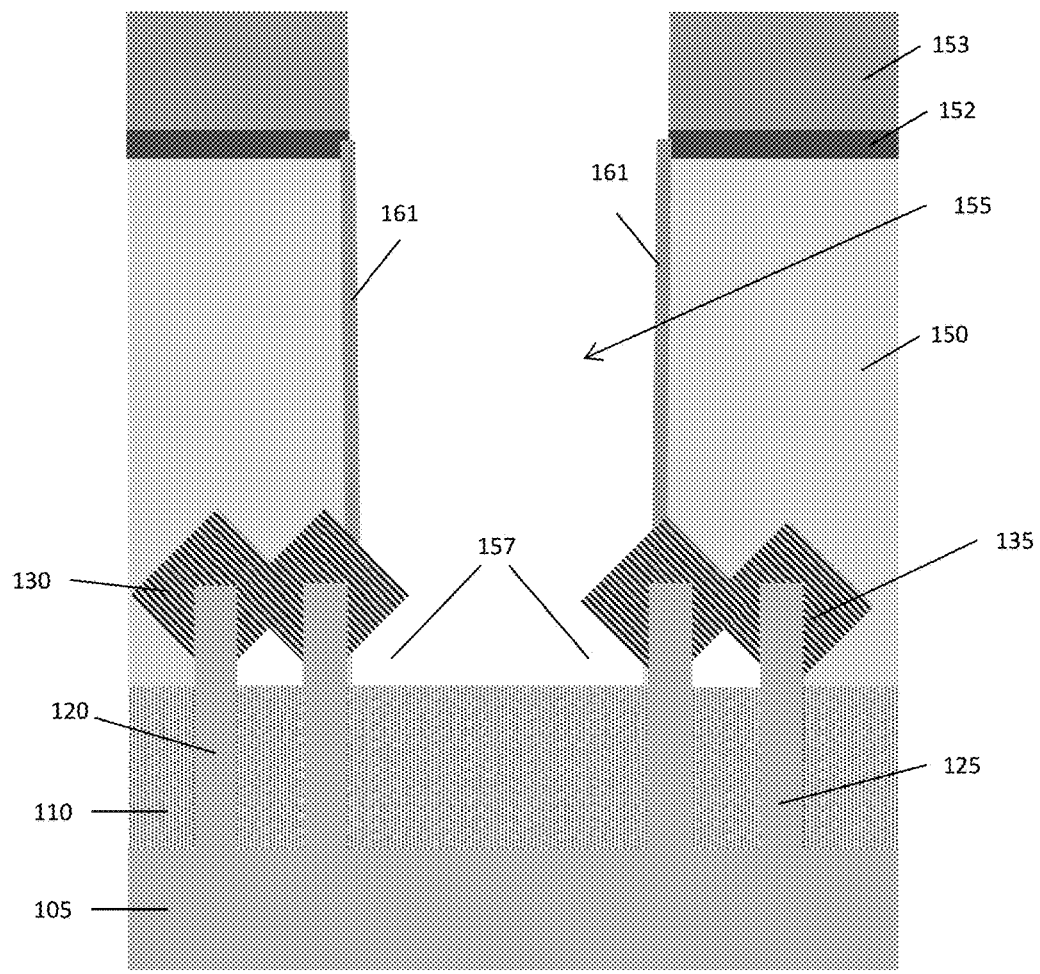

With respect to FIG. 20 in which like reference numerals refer to like features in FIG. 19 and at a subsequent fabrication stage of the processing method, remaining portions of the sacrificial layer 150 are removed with an isotropic etch process, such as an isotropic RIE process, from beneath the source/drain regions 130, 135, which leaves spaces 157 adjacent to the lower portion 155b of trench 155. Dielectric spacers 161 again protect portions of sacrificial layer 150 over source/drain regions 130, 135 that are to remain unetched for formation of dielectric pillar 165.

Figure 21:
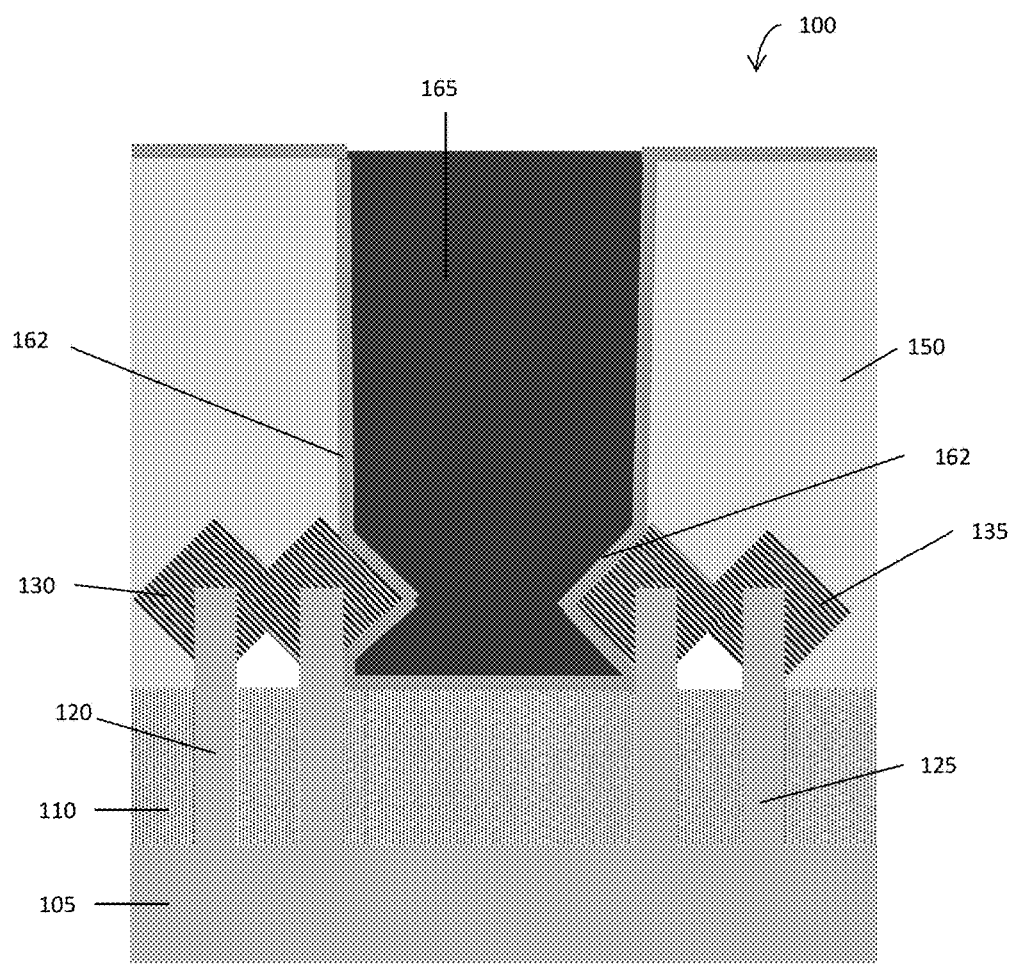

With respect to FIG. 21 in which like reference numerals refer to like features in FIG. 20 and at a subsequent fabrication stage of the processing method, a dielectric liner 162 is disposed over dielectric spacers 161, sidewalls of the lower portion of trench 155, and exposed portions of source/drain region 130 and source/drain region 135. Dielectric pillar 165 may then be formed. As dielectric material 160 is deposited in trench 155, as described above, the material conforms to the shape of the trench 155, including the shapes of outer portions of source/drain regions 130, 135. The dielectric pillar 165 formed may thus "wrap around" and conform to a portion of source/drain regions 130 and a portion of source/drain region 135 as shown in FIG. 21. An upper portion of dielectric pillar 165 may thus have a larger width than a lower portion of dielectric pillar 165.

With respect to FIG. 22 in which like reference numerals refer to like features in FIGS. 3A and 3B and FIGS. 16A and 16B and at a subsequent fabrication stage of either processing method, an upper portion 155a of trench 155 is etched in sacrificial layer 150. The upper portion 155a of trench 155 exposes a portion of source/drain region 130 and a portion of source/drain region 135. Upper portion 155a of trench 155 may be etched, for example, by a selective anisotropic RIE process, as previously described, using a lithographic stack (not depicted in FIGS. 22-24 for simplicity) that exposes a portion of sacrificial layer 150. FIG. 22 also shows dielectric spacers 161 formed on sidewalls of the upper portion 155a of trench 155. The dielectric spacers 161 may be formed, for example, via a plasma-assisted atomic-layer deposition (PEALD) process that deposits the material of the dielectric spacers 161 conformally over structure 10 followed by an anisotropic RIE etch of the material of the dielectric spacers 161 to remove the material from over the sacrificial layer 150 and a bottom surface of trench 155, leaving the dielectric spacers 161 in place. Dielectric spacers 161 may be composed of, for example, a nitride-based dielectric material such as silicon nitride.

With respect to FIG. 23 in which like reference numerals refer to like features in FIG. 22 and at a subsequent fabrication stage of the processing method, outer portions of source/drain regions 130 and 135, which have been exposed by etching the upper portion 155a of trench 155, are etched and removed via a selective etch process, such as a selective anisotropic RIE process. The material of sacrificial layer 150 in the lower portion 155b of trench 155, as well as in spaces 157 below source/drain regions 130, 135, may then be removed as described above and depicted in FIGS. 19 and 20. Etching the outer portions of source/drain region 130, 135 may help to ensure that a dielectric pillar 165 has a sufficient thickness between the source/drain regions 130, 135 to physically and electrically isolate the source/drain regions 130, 135 from one another and prevent electric shorts.

With respect to FIG. 24 in which like reference numerals refer to like features in FIG. 23 and at a subsequent fabrication stage of the processing method, a dielectric liner 162 is disposed over sidewalls of the second portion of trench 155 and over exposed portions of source/drain region 130 and source/drain region 135. Dielectric pillar 165 may then be formed. As dielectric material 160 is deposited in trench 155, as described above, the material conforms to the shape of the trench 155, including the shapes of outer portions of partially etched source/drain regions 130, 135. The dielectric pillar 165 formed may thus "wrap around" and conform to a portion of source/drain regions 130 and a portion of source/drain region 135 as shown in FIG. 23. An upper portion of dielectric pillar 165 may thus have a larger width than a lower portion of dielectric pillar 165.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first source/drain region and a second source/drain region adjacent to a temporary gate structure;
    forming a sacrificial layer over the first source/drain region and the second source/drain region;
    etching a trench in the sacrificial layer that is disposed between the first source/drain region and the second source/drain region;
    depositing a first dielectric material in the trench to form a dielectric pillar between the first source/drain region and the second source/drain region;
    after depositing the first dielectric material in the trench, forming a fill layer over the first source/drain region and the second source/drain region;
    after forming the fill layer, replacing the temporary gate structure with a functional gate structure;
    after replacing the temporary gate structure with the functional gate structure, removing the fill layer; and
    forming a conductive layer having a first portion contacting the first source/drain region and a second portion contacting the second source/drain region,
    wherein the dielectric pillar separates the first portion of the conductive layer from the second portion of the conductive layer.

2. The method of claim 1 wherein the sacrificial layer is composed of an organic planarization layer material.

3. The method of claim 1 further comprising:
    before depositing the first dielectric material in the trench, depositing a dielectric liner on sidewalls of the trench.

4. The method of claim 1 wherein etching the trench in the sacrificial layer comprises:
    forming a lithography stack over the sacrificial layer;
    forming an opening in the lithography stack to expose a portion of the sacrificial layer; and
    etching the exposed portion of the sacrificial layer.

5. The method of claim 1 wherein etching the trench in the sacrificial layer comprises:
    etching an upper portion of the trench in the sacrificial layer, the upper portion exposing a portion of the first source/drain region and a portion of the second source/drain region;
    forming a dielectric spacer on sidewalls of the upper portion of the trench; and
    etching a lower portion of the trench in the sacrificial layer, the dielectric liner material protecting remaining portions of the sacrificial layer arranged over the first source/drain region and the second source/drain region.

6. The method of claim 5 wherein etching the lower portion of the trench comprises:
    anisotropically etching the sacrificial layer disposed between the first source/drain region and the second source/drain region; and
    isotropically etching the sacrificial layer disposed below the portion of the first source/drain region and below the portion of the second source/drain region.

7. The method of claim 5 further comprising:
    depositing a dielectric liner on sidewalls of the lower portion of the trench, on the exposed portion of the first source/drain region, and on the exposed portion of the second source/drain region.

8. The method of claim 7 wherein the dielectric liner and the dielectric spacer are each composed of a second dielectric material.

9. The method of claim 5 further comprising:
    before forming the dielectric spacer, etching an outer portion of the first source/drain region and an outer portion of the second source/drain region.

* * * * *